United States Patent
Park et al.

(10) Patent No.: US 11,912,902 B2
(45) Date of Patent: *Feb. 27, 2024

(54) COMPOSITION FOR ETCHING AND MANUFACTURING METHOD OF SEMICONDUCTOR DEVICE USING THE SAME

(71) Applicant: SOULBRAIN CO., LTD., Seongnam-si (KR)

(72) Inventors: Jae-Wan Park, Seongnam-si (KR); Jung-Hun Lim, Seongnam-si (KR); Jin-Uk Lee, Seongnam-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/228,780

(22) Filed: Dec. 21, 2018

(65) Prior Publication Data

US 2019/0136090 A1 May 9, 2019

Related U.S. Application Data

(63) Continuation of application No. PCT/KR2017/015497, filed on Dec. 26, 2017.

(30) Foreign Application Priority Data

Dec. 26, 2016 (KR) .......................... 10-2016-0178754
Dec. 26, 2016 (KR) .......................... 10-2016-0178757

(Continued)

(51) Int. Cl.
*C09G 1/04* (2006.01)
*H01L 21/3105* (2006.01)
(Continued)

(52) U.S. Cl.
CPC .......... *C09G 1/04* (2013.01); *H01L 21/02458* (2013.01); *H01L 21/31056* (2013.01);
(Continued)

(58) Field of Classification Search
CPC ................ C09G 1/04; H01L 21/02458; H01L 21/31056; H01L 21/76224; H01L 27/11582; H01L 27/1157; H01L 21/31111
(Continued)

(56) References Cited

U.S. PATENT DOCUMENTS 9,868,902 B2 * 1/2018 Lee ................... H01L 29/66825
10,465,112 B2 * 11/2019 Lee ..................... H01L 21/0214
(Continued)

FOREIGN PATENT DOCUMENTS

CN 105273718 A 1/2016
CN 108102654 A 6/2018
(Continued)

OTHER PUBLICATIONS

Translation of JP2000058500 (Year: 2000).*
(Continued)

*Primary Examiner* — Duy Vu N Deo
(74) *Attorney, Agent, or Firm* — Jongkook Park

(57) ABSTRACT

The present invention relates to a composition for etching, comprising a first inorganic acid, a first additive represented by Chemical Formula 1, and a solvent.
The composition for etching is a high-selectivity composition that can selectively remove a nitride film while minimizing the etch rate of an oxide film, and which does not have problems such as particle generation, which adversely affect the device characteristics.

4 Claims, 13 Drawing Sheets

(30) Foreign Application Priority Data

Dec. 22, 2017 (KR) .................. 10-2017-0178590
Dec. 22, 2017 (KR) .................. 10-2017-0178591

(51) Int. Cl.

| | | |
|---|---|---|
| H01L 21/02 | (2006.01) | |
| H01L 21/311 | (2006.01) | |
| H10B 43/27 | (2023.01) | |
| H10B 43/35 | (2023.01) | |
| H01L 21/762 | (2006.01) | |

(52) U.S. Cl.

CPC ........ *H01L 21/31111* (2013.01); *H10B 43/27* (2023.02); *H10B 43/35* (2023.02); *H01L 21/76224* (2013.01)

(58) Field of Classification Search

USPC .......................................................... 252/79
See application file for complete search history.

(56) References Cited

U.S. PATENT DOCUMENTS

2015/0299848 A1* 10/2015 Haukka .................. C23C 16/02
  427/123
2016/0017224 A1* 1/2016 Lee ........................ C09K 13/06
  438/706

FOREIGN PATENT DOCUMENTS

| CN | 108231573 A | 6/2018 | | |
|---|---|---|---|---|
| JP | 2000058500 A | 2/2000 | | |
| JP | 2012222330 A | 11/2012 | | |
| JP | 2014099480 A | 5/2014 | | |
| JP | 2016029717 A | 3/2016 | | |
| KR | 20080044423 A | * 5/2008 | ............. | C09K 13/06 |
| KR | 1020080069444 A | 7/2008 | | |
| KR | 20110037766 A | 4/2011 | | |
| KR | 1020110037766 A | 4/2011 | | |
| KR | 1020160010267 A | 1/2016 | | |
| KR | 1020150124540 A | 4/2016 | | |
| KR | 1020160043170 A | 4/2016 | | |
| TW | 201311869 A | 3/2013 | | |
| WO | WO-2010090780 A1 | * 8/2010 | ....... | H01L 21/02068 |
| WO | WO-2012174518 A2 | * 12/2012 | ........ | H01L 21/31111 |

OTHER PUBLICATIONS

Wikipedia, silazane (Year: 2021).*
International Search Report for PCT/KR2017/015497 dated Apr. 23, 2018.

* cited by examiner

COMPOSITION FOR ETCHING AND MANUFACTURING METHOD OF SEMICONDUCTOR DEVICE USING THE SAME

CROSS-REFERENCE TO RELATED APPLICATIONS

This application claims priority under 35 U.S.C. § 119 to Korean Patent Application No. 10-2016-0178754, filed on Dec. 26, 2016, Korean Patent Application No. 10-2016-0178757, filed on Dec. 26, 2016, Korean Patent Application No. 10-2017-0178590, filed on Dec. 22, 2017, and Korean Patent Application No. 10-2017-0178591, filed on Dec. 22, 2017, in the Korean Intellectual Property Office, the disclosures of which are incorporated herein by reference in its entirety.

TECHNICAL FIELD

The present invention relates to a composition for etching, and more particularly, to a high-selectivity composition for etching capable of selectively removing a nitride film while minimizing the etching rate for an oxide film, and to a method of manufacturing a semiconductor device, the method including an etching process employing the etching composition.

BACKGROUND

In semiconductor manufacturing processes, representative insulating films include oxide films such as a silicon oxide film ($SiO_2$), and the like, and nitride films such as a silicon nitride film ($SiN_x$), and the like, which are used each independently, or in one or more alternately stacked layers. Further, these oxide and nitride films are also used as hard masks for forming electroconductive patterns such as metal wiring, and the like.

In a wet etching process for removing a nitride film, a mixture of phosphoric acid and deionized water is generally used. The deionized water is added in order to prevent a decrease in the etch rate and a variation in the etch selectivity for oxide films; however, there is a problem in that even a small change in the amount of deionized water supplied may cause defects in the process for removing a nitride film by etching. Furthermore, phosphoric acid is a strongly corrosive acid, and handling of this acid is difficult.

In order to solve these problems, technologies for removing nitride films using a composition for etching employing phosphoric acid ($H_3PO_4$) together with hydrofluoric acid (HF) or nitric acid (HNO 3) have been conventionally reported; however, these technologies have rather resulted in lowering of the etch selectivity between nitride films and oxide films. Further, technologies implementing a composition for etching including phosphoric acid and a silicic acid salt or silicic acid are also known, but these have a problem in that silicic acid or a silicic acid salt causes generation of particles that may adversely affect a substrate, and they are therefore rather unsuitable for the semiconductor manufacturing processes.

FIG. 1 and FIG. 2 are process cross-sectional views illustrating a device separation process for a flash memory device.

First, as illustrated in FIG. 1, a tunnel oxide film 11, polysilicon film 12, buffer oxide film 13, and pad nitride film are sequentially formed on substrate 10, and then the polysilicon film 12, buffer oxide film 13, and pad nitride film are selectively etched to form trenches. Subsequently, spin-on-dielectric (SOD) oxide film 15 is formed until the trenches are gap-filled, and then the SOD oxide film 15 is subjected to a chemical mechanical polishing (CMP) process using the pad nitride film (14) as a polishing stopper film.

Next, as illustrated in FIG. 2, the pad nitride film 14 is removed by wet etching using a phosphoric acid solution, and then the buffer oxide film 13 is removed by a washing process. Thereby, a device separation film 15A is formed in the field region. However, in the case of using phosphoric acid in such a wet etching process for removing a nitride film, due to a decrease in the etch selectivity between the nitride film and the oxide film, the nitride film as well as the SOD oxide film are etched, and thus, it becomes difficult to regulate the effective field oxide height (EFH). Accordingly, a sufficient wet etching time for removing the nitride film cannot be secured, or additional processes are needed, and thus phosphoric acid causes changes which adversely affect the device characteristics.

Therefore, under the current circumstances, there is a demand for a high-selectivity composition for etching that can selectively etch a nitride film with respect to an oxide film in a semiconductor production process, but which does not have problems such as particle generation.

SUMMARY

An object of the present invention is to provide a high-selectivity composition for etching that can selectively remove a nitride film while minimizing the etch rate of an oxide film, and which does not experience problems, such as particle generation, adversely affecting the device characteristics, and a method of manufacturing a semiconductor device using the same.

An embodiment of the present invention provides a composition for etching, comprising a first inorganic acid, a first additive represented by Chemical Formula 1, and a solvent.

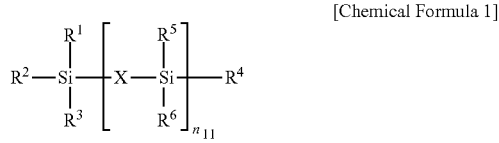

[Chemical Formula 1]

In Chemical Formula 1, X may be O or N; R1 to R6 may be each independently selected from the group consisting of hydrogen, a C1-C20 alkyl group, a C1-C20 alkoxy group, a C2-C20 alkenyl group, a C3-C20 cycloalkyl group, a C1-C20 aminoalkyl group, a C6-C20 aryl group, a C1-C20 alkyl carbonyl group, a C1-C20 alkyl carbonyloxy group, and a C1-C10 cyano alkyl group; n11 may be 0 or 1; and at least two of R1 to R4 may be C1-C20 alkoxy groups when n11 is 0.

The first inorganic acid may be one selected from the group consisting of sulfuric acid, nitric acid, phosphoric acid, silicic acid, hydrofluoric acid, boric acid, hydrochloric acid, perchloric acid, and mixtures thereof.

The composition for etching may include 0.01 to 15 wt % of the first additive and 70 to 99 wt % of the first inorganic acid, with the remaining amount as solvent.

The composition for etching may further comprise a second additive, including a silane inorganic acid salt produced by reacting a second inorganic acid with a silane compound.

The composition for etching may include 0.01 to 15 wt % of the second additive with respect to the total amount of the composition for etching.

According to another embodiment, the present invention provides a method of manufacturing a semiconductor device, comprising an etching process performed using the composition for etching.

The etching process may selectively etch for a nitride film with respect to an oxide film, and the etching process of the nitride film may be performed at a temperature of 50 to 300° C.

DETAILED DESCRIPTION OF EMBODIMENTS

Figure 1:
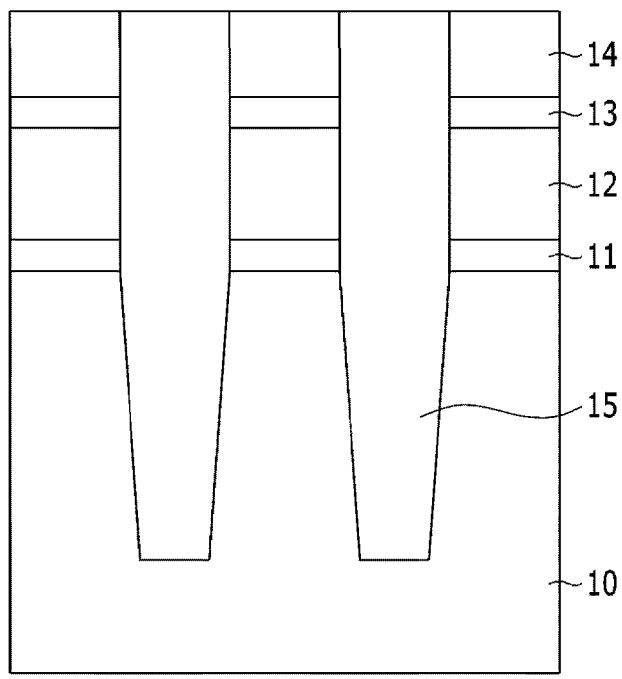
FIG. 1 and FIG. 2 are process cross-sectional views illustrating a device separation process for a flash memory device according to conventional technologies.
Figure 2:
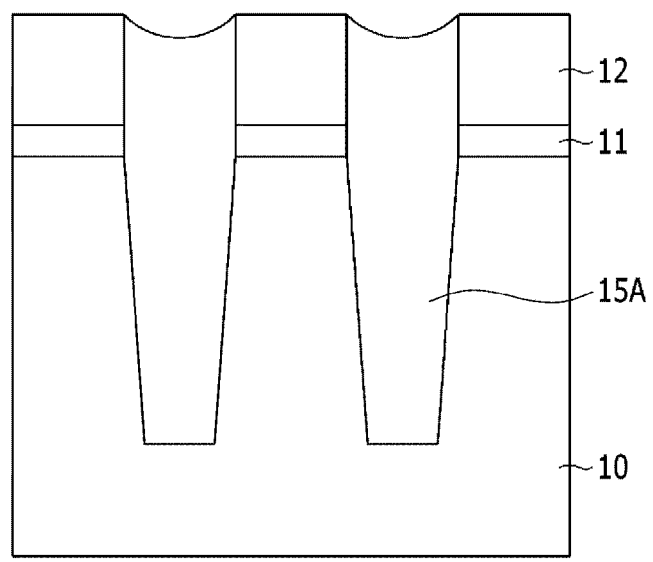

Hereinafter, a composition for etching according to the present invention and a method for manufacturing a semiconductor using the same is described in detail. The present invention may be subjected to various modifications and may include various embodiments, and thus particular embodiments will be described in detail in the detailed description of the invention. However, these embodiments are exemplary only and are not intended to limit the scope of the present invention, and it should be understood that the technical scope of the present invention includes all modifications, equivalents, and replacements that will be obvious to those skilled in the art.

The terms used in the invention are used only for the purpose of explaining particular embodiments and are not intended to limit the invention by any means. The expression of singularity also includes the expression of plurality, unless clearly stated otherwise in the context. It should be understood that the terms "including", "comprising" or "having" as used in the invention are only intended to indicate the existence of the features, values, stages, actions, constituent elements, component parts, or combinations thereof described in the specification, and they do not indicate the exclusion of any other features, values, stages, actions, constituent elements, component parts, and combinations thereof.

The composition for etching according to an embodiment of the invention comprises a first additive represented by Chemical Formula 1 below, and a solvent.

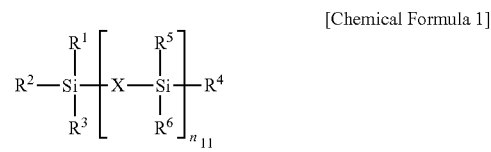

[Chemical Formula 1]

In Chemical Formula 1, X maybe O or N; R1 to R6 each, independently, may be selected from the group consisting of hydrogen, a C1-C20 alkyl group, a C1-C20 alkoxy group, a C2-C20 alkenyl group, a C3-C20 cycloalkyl group, a C1-C20 aminoalkyl group, a C6-C20 aryl group, a C1-C20 alkyl carbonyl group, a C1-C20 alkyl carbonyloxy group, and a C1-C10 cyano alkyl group; n11 may be 0 or 1; and at least two of R1 to R4 may be C1-C20 alkoxy groups when n11 is 0.

The additive of Chemical Formula 1 may be represented by Chemical Formula 2 when n11 is 0, and by Chemical Formula 3 when n11 is 1.

[Chemical Formula 2]

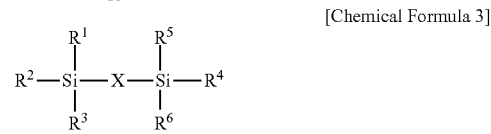

[Chemical Formula 3]

In Chemical Formulas 2 and 3, X and R1 to R6 may be defined in the same way as they are defined for Chemical Formula 1.

By having the above structure, the first additive represented by Chemical Formula 1 can improve the etching speed and selectivity of the silicon nitride film and silicon oxide film by controlling the direction of growth of the silicon ions generated during the high temperature etching process, and through end capping of the silicon ions. Further, the number of silicon particles generated during the etching process can be reduced by controlling the linear structure of the silicon ion growth, and silicon wafer yield can be improved by preventing self-coupling and self-reaction of the silicon ions through end capping of the ions.

The content of the first additive may be 0.01% to 15% by weight, preferably 0.1% to 15% by weight, more preferably 0.1% to 10% by weight, and even more preferably 0.1% to 5% by weight, with respect to the total weight of the composition for etching. When the content of the first additive is less than 0.01% by weight, high etch selectivity with respect to a nitride film cannot be obtained, and when the content exceeds 15% by weight, it is difficult to expect a further improvement in the effects associated with an increase in the content, while the thermal decomposition of the additive may rather reduce the effects.

Meanwhile, in addition to the first additive, the composition for etching may further comprise a second additive such as that described below.

The second additive may include a silane inorganic acid salt produced by reacting a second inorganic acid with a silane compound. The silane inorganic acid salt may control the etch rate of an oxide film, thereby facilitating control of the effective field oxide height (EFH).

According to an embodiment, the silane inorganic acid salt may be produced by reacting the second inorganic acid with the silane compound. Since the silane inorganic acid salt is produced by reacting the second inorganic acid with the silane compound, the silane inorganic acid salt may not be a compound having a single chemical structure, but may be a mixture of silane inorganic acid salts having various chemical structures. That is, the second additive may include a mixture of at least two or more silane inorganic acid salts having different chemical structures. However, the present invention is not limited thereto, and the second additive may also include only one kind of silane inorganic acid salt.

The second inorganic acid may be any one selected from the group consisting of sulfuric acid, fuming sulfuric acid, nitric acid, phosphoric acid, anhydrous phosphoric acid, pyrophosphoric acid, polyphosphoric acid, and mixtures thereof, and is preferably sulfuric acid, nitric acid, or phosphoric acid.

The silane compound may be any one selected from the group consisting of a compound represented by Chemical Formula 10 below, a compound represented by Chemical Formula 20 below, and a mixture thereof.

[Chemical Formula 10]

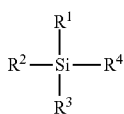

In Chemical Formula 10, R1 to R4 each, independently, may be any one selected from the group consisting of a hydrogen atom, a halogen atom, a C1-C10 alkyl group, a C1-C10 alkoxy group, and a C6-C30 aryl group; and at least one of R1 to R4 is a halogen atom or a C1-C10 alkoxy group.

The halogen atom may be a fluoro group, a chloro group, a bromo group, or an iodo group, and preferably a fluoro group or a chloro group.

Specifically, the compound represented by Chemical Formula 10 may be a halosilane or an alkoxysilane compound.

The halosilane compound may be any one selected from the group consisting of trimethylchlorosilane, triethylchlorosilane, tripropylchlorosilane, trimethylfluorosilane, triethylfluorosilane, tripropylfluorosilane, dimethyldichlorosilane, diethyldichlorosilane, dipropyldichlorosilane, dimethyldifluorosilane, diethyldifluorosilane, dipropyldifluorosilane, ethyltrichlorosilane, propyltrichlorosilane, methyltrifluorosilane, ethyltrifluorosilane, propyltrifluorosilane, and mixtures thereof.

The alkoxysilane compound may be any one selected from the group consisting of tetramethoxysilane (TMOS), tetrapropoxysilane, methyltrimethoxysilane (MTMOS), methyltriethoxysilane (MTEOS), methyltripropoxysilane, ethyltrimethoxysilane, ethyltriethoxysilane, ethyltripropoxysilane, propyltrimethoxysilane (PrTMOS), propyltriethoxysilane (PrTEOS), propyltripropoxysilane, dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane, dipropyldipropoxysilane, trimethylmethoxysilane, trimethylethoxysilane, trimethylpropoxysilane, triethylmethoxysilane, triethylethoxysilane, triethylpropoxysilane, tripropylmethoxysilane, tripropylethoxysilane, tripropylpropoxysilane, 3-chloropropyltrimethoxysilane, 3-aminopropyltrimethoxysilane, 3-aminopropyltriethoxysilane, [3-(2-aminoethyl)aminopropyl]trimethoxysilane, 3-mercaptopropyltrimethoxysilane, 3-methacryloxypropyltrimethoxysilane, 3-acryloxypropyltrimethoxysilane, and mixtures thereof.

[Chemical Formula 20]

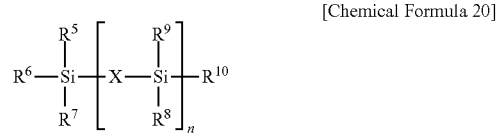

In Chemical Formula 20, R5 to R10 each, independently, may be any one selected from the group consisting of a hydrogen atom, a halogen atom, a C1-C10 alkyl group, a C1-C10 alkoxy group, and a C6-C30 aryl group; at least one from among R5 to R10 is a halogen atom or a C1-C10 alkoxy group; and n represents an integer from 1 to 10.

The halogen atom may be a fluoro group, a chloro group, a bromo group, or an iodo group, and the halogen atom is preferably a fluoro group or a chloro group.

Specifically, examples of the compound represented by Chemical Formula 20 include chlorodimethylsiloxy-chlorodimethylsilane, chlorodiethylsiloxy-chlorodimethylsilane, dichloromethylsiloxy-chlorodimethylsilane, dichloroethylsiloxy-chlorodimethylsilane, trichlorosiloxy-chlorodimethylsilane, fluorodimethylsiloxy-chlorodimethylsilane, difluoromethylsiloxy-chlorodimethylsilane, trifluorosiloxy-chlorodimethylsilane, methoxydimethylsiloxy-chlorodimethylsilane, dimethoxymethylsiloxy-chlorodimethylsilane, trimethoxysiloxy-chlorodimethylsilane, ethoxydimethylsiloxy-chlorodimethylsilane, diethoxymethylsiloxy-chlorodimethylsilane, triethoxysiloxy-chlorodimethylsilane, chlorodimethylsiloxy-dichloromethylsilane, trichlorosiloxy-dichloromethylsilane, chlorodimethylsiloxy-trichlorosilane, dichloromethylsiloxy-trichlorosilane, and trichlorosiloxy-trichlorosilane.

The silane inorganic acid salt may be produced by adding the silane compound to the second inorganic acid, and then reacting the mixture at a temperature of 20° C. to 300° C., and preferably 50° C. to 200° C. At this time, the reaction may be carried out while removing the air and moisture. When the reaction temperature is below 20° C., the silane compound may be crystallized, or the silane compound may evaporate due to a low reaction rate. When the reaction temperature exceeds 300° C., the second inorganic acid may be vaporized.

The second inorganic acid and the silane compound may be reacted at a proportion of the silane compound of 0.001 to 50 parts by weight, and preferably 0.01 to 30 parts by weight, with respect to 100 parts by weight of the second inorganic acid. When the amount of the silane compound reacted is less than 0.001 parts by weight, the realization of selectivity may be difficult due to the small content ratio of the silane compound, and when the amount exceeds 50 parts by weight, the silane compound may be precipitated, or an amorphous structure may be produced.

Volatile side products that are generated at the time of reaction may be removed by distillation under reduced pressure. The product of the above-described reaction may be purified to separate the silane inorganic acid salt, which may then be added to the composition for etching. Alternatively, it is also possible to add the reaction product to the composition for etching without purification.

The reaction may be carried out in the presence or absence of an aprotic solvent, and in the case of using an aprotic solvent, a solvent or solvent mixture having a boiling point or a boiling range up to 120° C. at 10,013 mbar may preferably be used. Examples of the solvent include dioxane; tetrahydrofuran; diethyl ether; diisopropyl ether; diethylene glycol dimethyl ether; chlorinated hydrocarbons, for example, dichloromethane, trichloromethane, tetrachloromethane, 1,2-dichloroethane, and trichloroethylene; hydrocarbons, for example, pentane, n-hexane, a mixture of hexane isomers, heptane, octane, benzine, petroleum ether, benzene, toluene, and xylene; ketones, for example, acetone, methyl ethyl ketone, diisopropyl ketone, and methyl isobutyl ketone (MIBK); esters, for example, ethyl acetate, butyl acetate, propyl propionate, ethyl butyrate, ethyl isobutyrate, carbon disulfide, and nitrobenzene; and mixtures thereof.

As described above, since the silane inorganic acid salt is produced by reacting the second inorganic acid with the silane compound, the silane inorganic acid salt may not be a compound having a single chemical structure, but may be a mixture of silane inorganic acid salts having various chemical structures. That is, the silane inorganic acid salts may be a product resulting from alternate reactions between the second inorganic acid and the silane compound, or may be a mixture of silane inorganic acid salts having various chemical structures obtained as a result of reacting into a linear form or a branched form, depending on the number and positions of the halogen atoms in the silane compound.

Specific examples of the silane inorganic acid salts having various chemical structures include the compounds of the chemical formulas below. However, the silane inorganic acid salt of the present invention is not limited thereto.

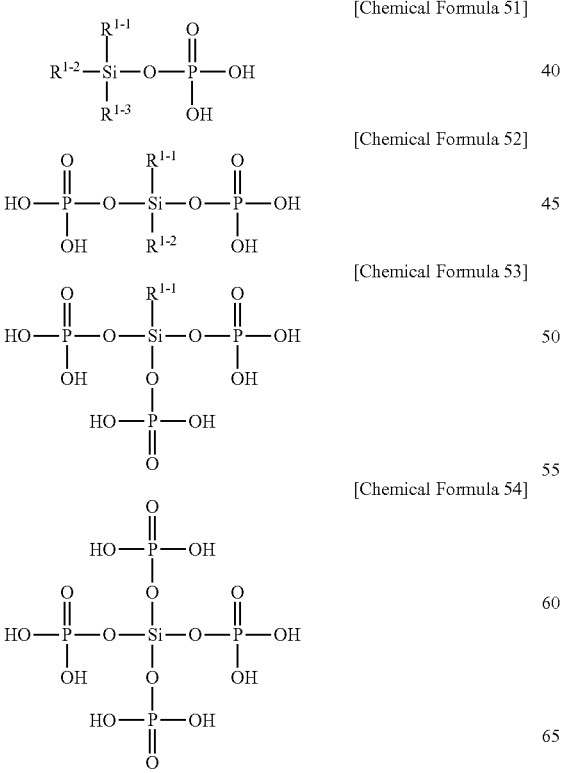

[Chemical Formula 51]

[Chemical Formula 52]

[Chemical Formula 53]

[Chemical Formula 54]

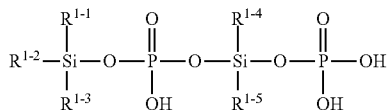

[Chemical Formula 55]

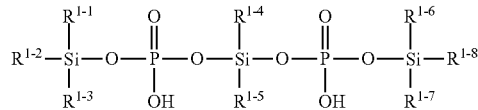

[Chemical Formula 56]

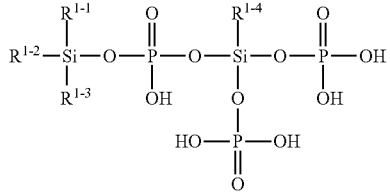

[Chemical Formula 57]

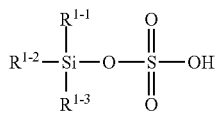

[Chemical Formula 61]

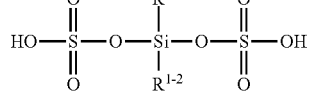

[Chemical Formula 62]

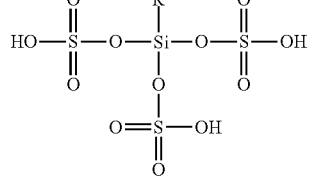

[Chemical Formula 63]

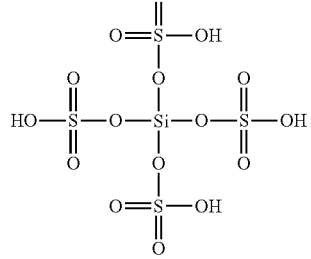

[Chemical Formula 64]

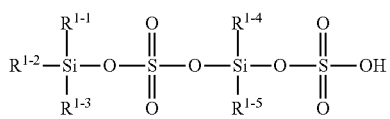

[Chemical Formula 65]

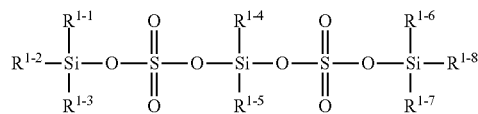

[Chemical Formula 66]

-continued

[Chemical Formula 67]

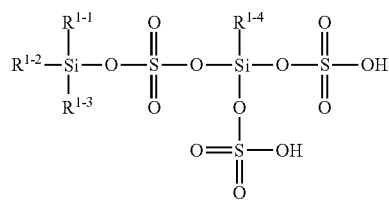

[Chemical Formula 71]

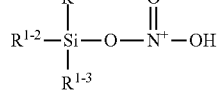

[Chemical Formula 72]

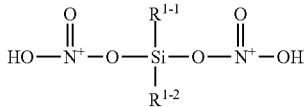

[Chemical Formula 73]

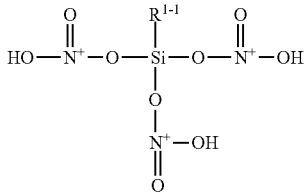

[Chemical Formula 74]

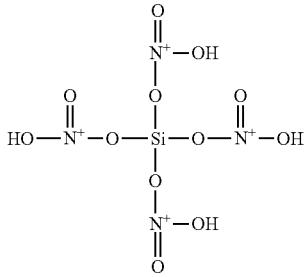

[Chemical Formula 75]

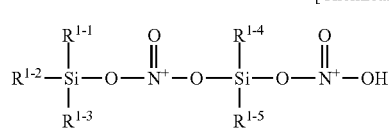

[Chemical Formula 76]

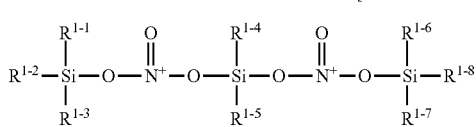

[Chemical Formula 77]

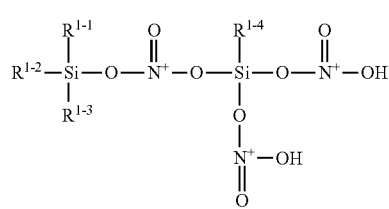

In Chemical Formulas 51 to 57, 61 to 67, and 71 to 77, R1-1 to R1-8 each, independently, may be any one selected from the group consisting of a hydrogen atom, a halogen atom, a C1-C10 alkyl group, a C1-C10 alkoxy group, and a C6-C30 aryl group; and the halogen atom may be a fluoro group, a chloro group, a bromo group, or an iodo group, while it is preferably a fluoro group or a chloro group.

The content of the silane inorganic acid salt may be 0.01% to 15% by weight, preferably 0.1% to 15% by weight, more preferably 0.1% to 10% by weight, and even more preferably 0.1% to 5% by weight, with respect to the total weight of the composition for etching. When the content of the silane inorganic acid salt is less than 0.01% by weight, a high etch selectivity for a nitride film cannot be obtained, and when the content exceeds 15% by weight, it is difficult to expect a further increase in the effects associated with an increase in the content, and there may rather be problems such as particle generation.

According to another embodiment, the silane inorganic acid salt may be produced by reacting polyphosphoric acid with the silane compound represented by Chemical Formula 10. At this time, the silane inorganic acid salt may be represented by Chemical Formula 100 below.

[Chemical Formula 100]

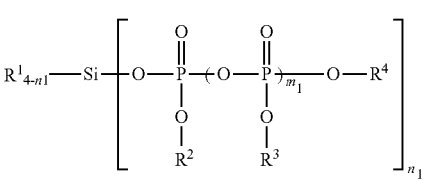

In Chemical Formula 100, R1 may be any one selected from the group consisting of a hydrogen atom, a halogen atom, a C1-C10 alkyl group, a C1-C10 alkoxy group, and a C6-C30 aryl group; the halogen atom may be a fluoro group, a chloro group, a bromo group, or an iodo group, but is preferably a fluoro group or a chloro group; $n_1$ is an integer from 1 to 4; $m_1$ is an integer from 1 to 10; and R2 to R4 each represent a hydrogen atom. However, optionally, any one hydrogen atom selected from among the group consisting of R2 to R4 may be substituted by a substituent represented by Chemical Formula 120 below.

[Chemical Formula 120]

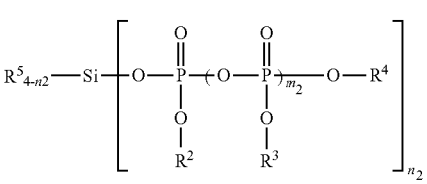

In Chemical Formula 120, any one of the R5 groups is a linking group linked to a structure represented by Chemical Formula 100, and the others each, independently, may be any one selected from the group consisting of a hydrogen atom, a halogen atom, a C1-C10 alkyl group, a C1-C10 alkoxy group, and a C6-C30 aryl group. That is, in the case in which there are four units of R5, one of them is a linking group linked to the structure of Chemical Formula 100, and the remaining three may be each, independently, any one selected from the group consisting of a hydrogen atom, a halogen atom, a C1-C10 alkyl group, a C1-C10 alkoxy group, and a C6-C30 aryl group. Furthermore, in the case in which there is only one unit of R5, this R5 represents a linking group linked to the structure of Chemical Formula 100.

Here, $n_2$ represents an integer from 0 to 3, and $m_2$ represents an integer from 1 to 10.

In Chemical Formula 120, R2 to R4 may each, independently, be a hydrogen atom, or may be substituted by a second substituent represented by Chemical Formula 120. That is, a second substituent represented by Chemical Formula 120 may be substituted at any one of the R2 to R4 positions, and a third substituent represented by Chemical Formula 120 may further be substituted at any one of the R2 to R4 positions of the second substituent represented by Chemical Formula 120. This is because the silane inorganic acid salt is produced by reacting the polyphopshoric acid with the silane compound. That is, the compound represented by Chemical Formula 100 is produced as a result of the reaction between the polyphosphoric acid and the silane compound, and a hydroxyl group at any one of the R2 to R4 positions of a moiety derived from the polyphosphoric acid may react again with the silane compound, which is a reaction starting material. Subsequently, the silane compound that has reacted with the compound represented by Chemical Formula 100 may react again with the polyphosphoric acid, which is a reaction starting material, and such a reaction may proceed continuously.

An example of the silane inorganic acid salt resulting from the continuous procession of the reaction is as follows.

As an example, in Chemical Formula 100, in the case in which $n_1$ is 1, $m_1$ is 1, and R2 to R4 are all hydrogen atoms, the compound may be equivalent to Chemical Formula 101 below. Here, the definitions for R1-1 to R1-3 are the same as the definition for R1.

[Chemical Formula 101]

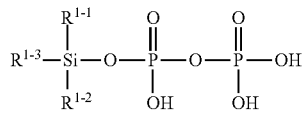

A compound represented by Chemical Formula 102 below is the same as the compound represented by Chemical Formula 101, except that $m_1$ is 2.

[Chemical Formula 102]

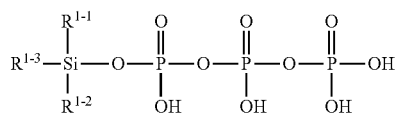

As another example, in Chemical Formula 100, in the case in which $n_1$ is 2, $m_1$ is 1, and R2 to R4 all represent hydrogen atoms, the compound may be equivalent to Chemical Formula 103 below. Here, the definitions for R1-1 and R1-2 are the same as the definition for R1.

[Chemical Formula 103]

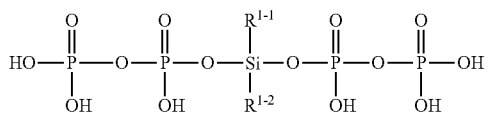

In Chemical Formula 100, in an example of the case in which $n_1$ is 1, $m_1$ is 1, R2 and R3 both represent a hydrogen atom, and R4 is substituted by a substituent represented by Chemical Formula 120, the compound may be equivalent to Chemical Formula 104 below. In Chemical Formula 120, $n_2$ is 0, and any one of the R5 groups is a linking group linked to a structure represented by Chemical Formula 100. Here, the definitions for R1-1 to R1-6 are the same as the definition for R1. A compound represented by Chemical Formula 104 below is a resultant product produced when a moiety derived from the polyphosphoric acid and having a substituent represented by R4 in the compound represented by Chemical Formula 100 reacts again with the silane compound as a reaction starting substance.

[Chemical Formula 104]

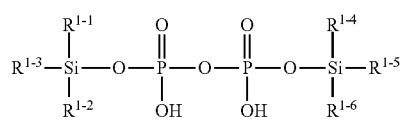

In Chemical Formula 100, as an example of the case in which $n_1$ is 1, $m_1$ is 1, R3 and R4 are each hydrogen atoms, and R2 is substituted with a substituent represented by Chemical Formula 120, the compound may be equivalent to Chemical Formula 105 below. In Chemical Formula 120, $n_2$ is 1, $m_2$ is 1, any one of the R5 groups represents a linking group linked to a structure represented by Chemical Formula 100, and R2 to R4 all represent hydrogen atoms. Here, the definitions for R1-1 to R1-5 are the same as the definition for R1 described above. A compound represented by Chemical Formula 105 below is a resultant product produced when a hydroxyl group at any one of the R4 positions of a moiety derived from the polyphosphoric acid in the compound represented by Chemical Formula 100 reacts again with the silane compound as a reaction starting substance, and subsequently the silane compound that has reacted with the compound represented by Chemical Formula 100 reacts again with the polyphosphoric acid as a reaction starting substance.

[Chemical Formula 105]

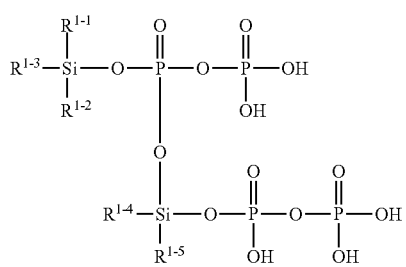

Compounds represented by Chemical Formulas 106 and 107 below are the same as the compound represented by Chemical Formula 105, except that the position of the substituent represented by Chemical Formula 120 has been changed from the R2-position of Chemical Formula 100 to the R3- and R4-position, respectively.

[Chemical Formula 106]

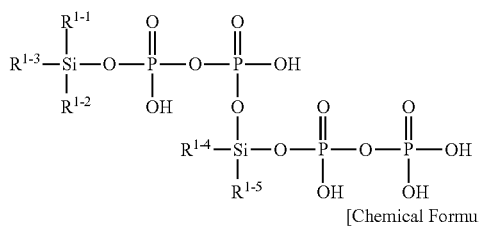

[Chemical Formula 107]

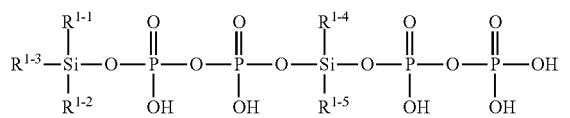

In Chemical Formula 100, in an example of the case in which $n_1$ represents 1; $m_1$ represents 1; R2 and R3 each represent a hydrogen atom; R4 is substituted by a substituent represented by Chemical Formula 120; and a second substituent represented by Chemical Formula 120 is substituted at the R4-position of the substituent represented by Chemical Formula 120, the compound may be equivalent to Chemical Formula 108 below. In Chemical Formula 120, $n_2$ represents 1; $m_2$ represents 1; any one of the R5's represents a linking group linked to a structure represented by Chemical Formula 100; and R2 and R3 are hydrogen atoms. At this time, the definitions for R1-1 to R1-7 are the same as the definition for R1 described above. A compound represented by Chemical Formula 108 below is a resultant product produced when a hydroxyl group of a moiety derived from the polyphosphoric acid on the right-hand side terminal of the compound represented by Chemical Formula 107 reacts again with the silane compound as a reaction starting substance, and subsequently the silane compound that has reacted with the compound represented by Chemical Formula 107 reacts again with the polyphosphoric acid as a reaction starting substance.

[Chemical Formula 108]

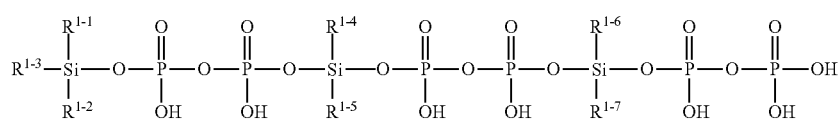

The present invention is not intended to be limited to the compounds exemplified by Chemical Formulas 101 to 108, and various modifications can be made based on the compounds described above as references.

Meanwhile, the silane compound that can react with the polyphosphoric acid and thereby produce the silane inorganic acid salt represented by Chemical Formula 100 may be a compound represented by Chemical Formula 10 described above. The details of the compound represented by Chemical Formula 10 are as described above.

The polyphosphoric acid may be pyrophosphoric acid, containing two phosphorus atoms, or a polyphosphoric acid, containing three or more phosphorus atoms.

The method of manufacturing the silane inorganic acid salt by reacting the polyphosphoric acid with the silane compound is the same as the method of manufacturing the silane inorganic acid salt by reacting the second inorganic acid with the silane compound, except that the polyphosphoric acid is used instead of the second inorganic acid.

According to an embodiment, the silane inorganic acid salt may be a siloxane inorganic acid salt produced by reacting any one of the second inorganic acids selected from the group consisting of phosphoric acid, phosphoric acid anhydride, pyrophosphoric acid, polyphosphoric acid, and mixtures thereof, with a siloxane compound represented by Chemical Formula 20.

Here, the siloxane inorganic acid salt may be represented by Chemical Formula 200 below.

[Chemical Formula 200]

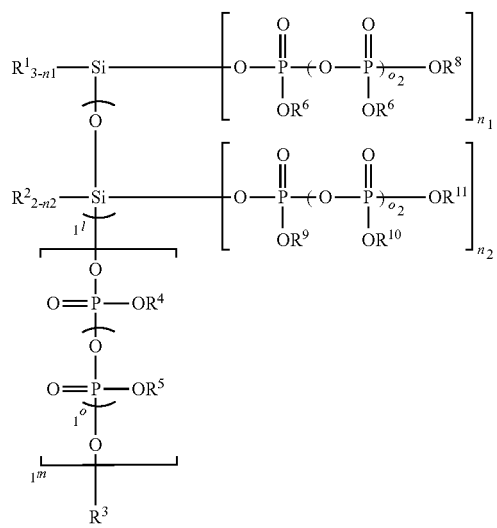

In Chemical Formula 200, R1 and R2 each, independently, represent any one selected from the group consisting of a hydrogen atom, a halogen atom, a C1-C10 alkyl group, a C1-C10 alkoxy group, and a C6-C30 aryl group, wherein the halogen atom may be a fluoro group, a chloro group, a bromo group, or an iodo group, while the halogen atom is preferably a fluoro group or a chloro group.

Here, n1 represents an integer from 0 to 3; $n_2$ represents an integer from 0 to 2; $m_1$ represents an integer of 0 or 1; and the relation $n_1+n_2+m_1 \geq 1$ is satisfied. That is, Chemical Formula 200 includes at least one atomic group derived from the second inorganic acid, such as phosphoric acid.

$l_1$ represents an integer from 1 to 10; and $o_1$f to $o_3$ each, independently, represent an integer from 0 to 10.

Further, R3 to R11 each represent a hydrogen atom. However, any one hydrogen atom selected from the group consisting of R3 to R11 may optionally be substituted by a substituent represented by Chemical Formula 220 below.

[Chemical Formula 220]

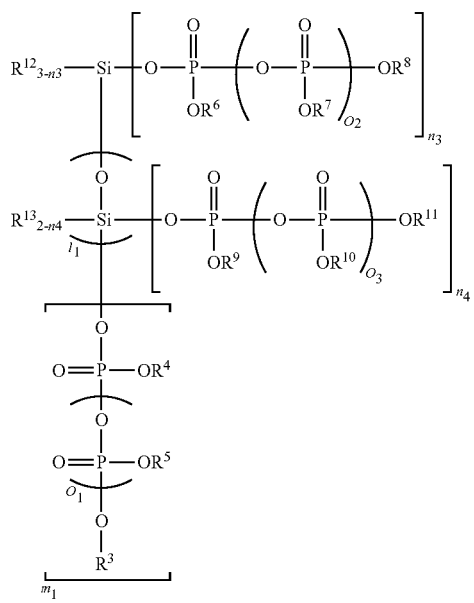

In Chemical Formula 220, any one of the R12's and R13's is a linking group linked to a structure represented by Chemical Formula 200, and the others each, independently, represent any one selected from the group consisting of a hydrogen atom, a halogen atom, a C1-C10 alkyl group, a C1-C10 alkoxy group, and a C6-C30 aryl group. That is, in a case in which there are two units of R12 and one unit of R13, one of them is a linking group linked to a structure represented by Chemical Formula 200, while the other two may each, independently, represent any one selected from the group consisting of a hydrogen atom, a halogen atom, a C1-C10 alkyl group, a C1-C10 alkoxy group, and a C6-C30 aryl group. Further, in a case in which there is one unit of R12 and zero units of R13, R12 is a linking group linked to a structure represented by Chemical Formula 200.

Here, $n_3$ represents an integer from 0 to 3; $n_4$ represents an integer from 0 to 2; and $m_1$ represents an integer of 0 or 1. $l_1$ represents an integer from 1 to 10, and $o_1$ to $o_3$ each, independently, represent an integer from 0 to 10.

Additionally, R3 to R11 may each, independently, represent a hydrogen atom, or they may each, independently, be substituted by a second substituent represented by Chemical Formula 220. That is, a second substituent represented by Chemical Formula 220 may be substituted at any one of the R3- to R11-positions, and a third substituent represented by Chemical Formula 220 may also be substituted at any one of the R3- to R11-positions of the second substituent represented by Chemical Formula 220.

This is because the siloxane inorganic acid salt is a product produced by reacting the second inorganic acid with the siloxane compound. That is, the second inorganic acid reacts with the siloxane compound, and a compound represented by Chemical Formula 200 described above is produced. A hydroxyl group at any one of the R3- to R11-positions of a moiety derived from the second inorganic acid in the compound represented by Chemical Formula 200 can react again with the siloxane compound as a reaction starting substance, and subsequently, the siloxane compound that has reacted with the compound represented by Chemical Formula 200 can react again with the second inorganic acid as a reaction starting substance. Thus, these reactions can proceed continuously.

The resultant siloxane inorganic acid salts obtained by the successive progression of the reaction above are exemplified as follows.

In Chemical Formula 200, as an example of the case in which $n_1$ represents 1; $n_2$ represents zero; $m_1$ represents zero; $l_1$ represents 1; $o_1$ to $o_3$ each represent zero; and R3 to R11 all represent a hydrogen atom, the compound may be equivalent to Chemical Formula 201 below. Here, the definitions for R1- and R1-2 are the same as the definition for R1 described above, and the definitions for R2-1 and R2-2 are the same as the definition for R2 described above.

[Chemical Formula 201]

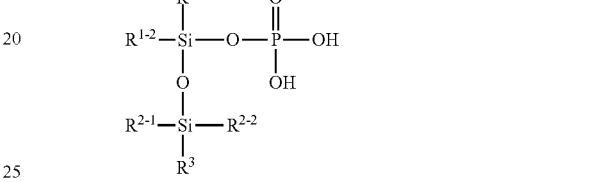

A compound represented by Chemical Formula 202 below may be the same as a compound represented by Chemical Formula 201, except that $n_2$ is 1.

[Chemical Formula 202]

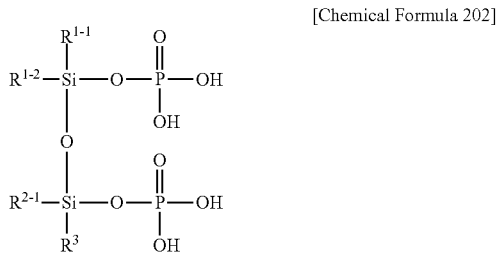

A compound represented by Chemical Formula 203 below may be the same as a compound represented by Chemical Formula 201, except that $o_2$ and $o_3$ are both 1.

[Chemical Formula 203]

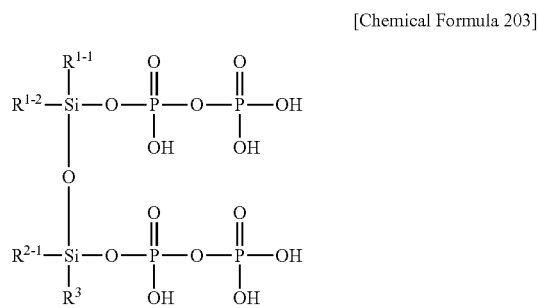

A compound represented by Chemical Formula 204 below may be the same as a compound represented by Chemical Formula 202, except that $l_1$ is 2.

[Chemical Formula 204]

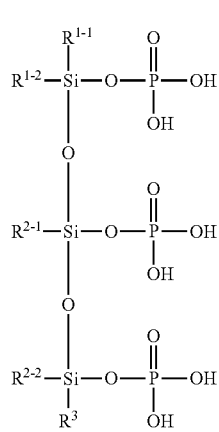

In Chemical Formula 200, in an example of the case in which $n_1$ and $n_2$ each represent 2; $m_1$ represents zero; $l_1$ represents 1; $o_1$ to $o_3$ each represent zero; and R3 to R11 all represent a hydrogen atom, the compound may be equivalent to Chemical Formula 205 below.

[Chemical Formula 205]

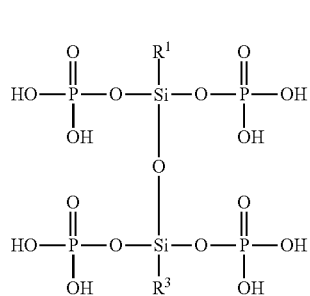

In Chemical Formula 200, in an example of the case in which $n_1$ represents 1; $n_2$ represents 1; $m_1$ represents zero; $l_1$ represents 1; $o_1$ to $o_3$ each represent zero; R6, R9, and R11 each represent a hydrogen atom; and R8 is substituted by a substituent represented by Chemical Formula 220, the compound may be equivalent to Chemical Formula 206 below. In Chemical Formula 220, $n_3$ and $n_4$ each represent zero; $m_1$ represents zero; $l_1$ represents 1; and any one of the R12's is a linking group linked to a structure represented by Chemical Formula 200. Here, the definitions for R1-1 to R1-7 are the same as the definition for R1, and the definition for R2-1 is the same as the definition for R2. A compound represented by Chemical Formula 206 below is a resultant product produced when a hydroxyl group at the R8-position of a moiety derived from the second inorganic acid in the compound represented by Chemical Formula 200 reacts again with the siloxane compound as a reaction starting substance.

[Chemical Formula 206]

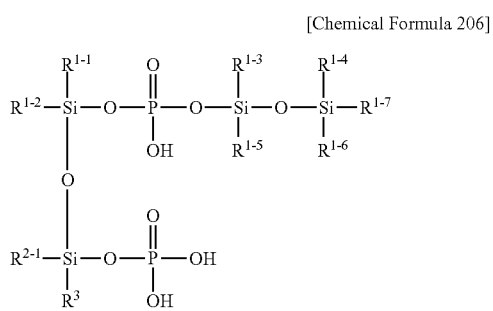

In Chemical Formula 200, in an example of the case in which $n_1$ represents 1; $n_2$ represents 1; $m_1$ represents zero; $l_1$ represents 1; $o_1$ to $o_3$ each represent zero; R6, R9, and R11 each represent a hydrogen atom; and R8 is substituted by a substituent represented by Chemical Formula 220, the compound may be equivalent to Chemical Formula 207 below. In Chemical Formula 220, $n_3$ and $n_4$ each represent 1; $m_1$ represents zero; $o_2$ and $o_3$ each represent zero; any one of the R12's is a linking group linked to a structure represented by Chemical Formula 200; and R6, R8, R9, and R11 each represent a hydrogen atom. Here, the definitions for R1-1 to R1-3 are the same as the definition for R1; the definitions for R2-1 and R2-2 are the same as the definition for R2; and the definitions for R3-1 and R3-2 are the same as the definition for R3. A compound represented by Chemical Formula 207 below is a resultant product produced when a hydroxyl group at the R8-position of a moiety derived from the second inorganic acid in the compound represented by Chemical Formula 200 reacts again with the siloxane compound as a reaction starting substance, and subsequently, the siloxane compound that has reacted with the compound represented by Chemical Formula 200 reacts again with the second inorganic acid as a reaction starting substance.

[Chemical Formula 207]

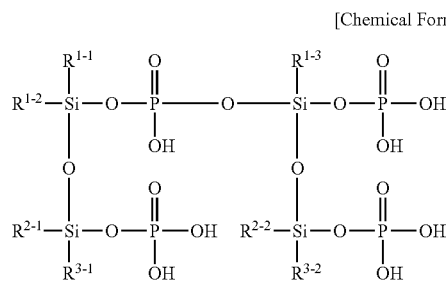

A compound represented by Chemical Formula 208 below may be the same as a compound represented by Chemical Formula 207, except that the substituent represented by Chemical Formula 220 is linked to Chemical Formula 200 at the R1-3-position of Chemical Formula 207.

[Chemical Formula 208]

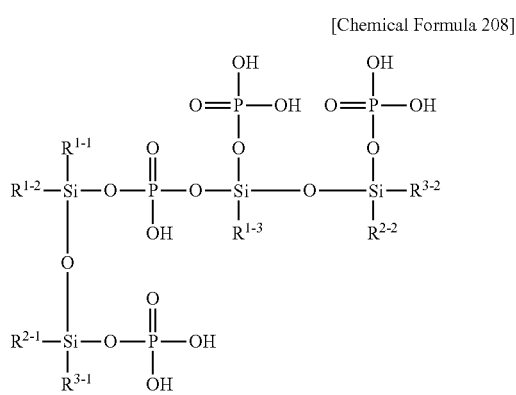

In Chemical Formula 200, in an example of the case in which $n_1$ represents 1; $n_2$ represents 1; $m_1$ represents 0; $l_1$ represents 1; $o_1$ to $o_3$ each represent zero; R3, R6, R9, and R11 each represent a hydrogen atom; R8 is substituted by a first substituent represented by Chemical Formula 220; and R8 of the first substituent represented by Chemical Formula 220 is substituted by a second substituent represented by Chemical Formula 220, the compound may be equivalent to Chemical Formula 209 below. In the first substituent represented by Chemical Formula 220, $n_3$ and $n_4$ each represent 1; $m_1$ represents zero; $l_1$ represents 1; $o_2$ and $o_3$ each represent zero; any one of the R12's is a linking group linked to a structure represented by Chemical Formula 200; R6, R9, and R11 each represent a hydrogen atom; and R8 represents a second substituent represented by Chemical Formula 220. In the second substituent represented by Chemical Formula 220, $n_3$ and $n_4$ each represent 1; $m_1$ represents 0; $l_1$ represents 1; $o_2$ and $o_3$ each represent zero; any one of the R12's represents a linking group linked to the first substituent represented by Chemical Formula 220; and R6, R8, R9, and R11 each represent a hydrogen atom. Here, the definitions for R1-1 to R1-4 are the same as the definition for R1; the definitions for R2-1 to R2-3 are the same as the definition for R2; and the definitions for R3-1 to R3-3 are the same as the definition for R3.

A compound represented by Chemical Formula 209 below is a resultant product produced when a moiety derived from the second inorganic acid at the right-hand end of the compound represented by Chemical Formula 207 is reacted again with the siloxane compound as a reaction starting substance, and subsequently, the siloxane compound that has reacted with the compound represented by Chemical Formula 207 reacts again with the second inorganic acid as a reaction starting substance.

[Chemical Formula 209]

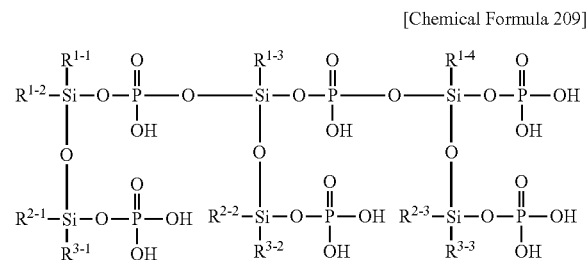

A compound represented by Chemical Formula 210 below may be the same as a compound represented by Chemical Formula 209, except that the second substituent represented by Chemical Formula 220 is linked to a structure represented by Chemical Formula 200 at the R1-4-position of Chemical Formula 209.

[Chemical Formula 210]

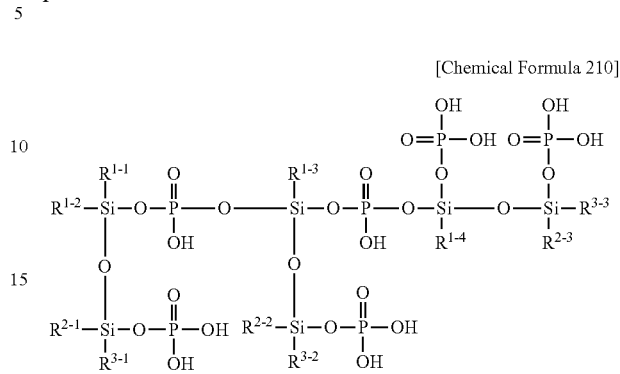

The present invention is not intended to be limited to the compounds represented by Chemical Formulas 201 to 210, and various modifications can be made based on the compounds described above.

According to an embodiment, the silane inorganic acid salt may be a siloxane inorganic acid salt produced by reacting any one of the second inorganic acids selected from the group consisting of sulfuric acid, fuming sulfuric acid, and a mixture thereof, with the siloxane compound represented by Chemical Formula 20.

Here, the siloxane inorganic acid salt may be represented by Chemical Formula 230 below.

[Chemical Formula 230]

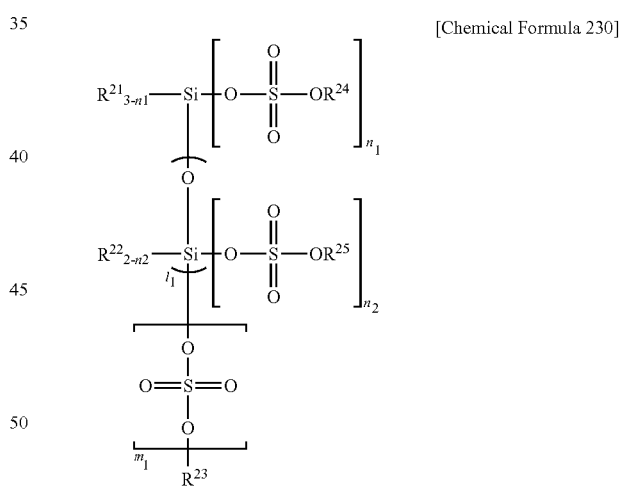

In Chemical Formula 230, R21 and R22 each, independently, represent any one selected from the group consisting of a hydrogen atom, a halogen atom, a C1-C10 alkyl group, a C1-C10 alkoxy group, and a C6-C30 aryl group, wherein the halogen atom may be a fluoro group, a chloro group, a bromo group, or an iodo group, while the halogen atom is preferably a fluoro group or a chloro group.

Further, $n_1$ represents an integer from 0 to 3; $n_2$ represents an integer from 0 to 2; $m_1$ represents an integer of 0 or 1; and the relation $n_1+n_2+m_1 \geq 1$ is satisfied. That is, Chemical Formula 230 contains at least one atomic group derived from the second inorganic acid, such as sulfuric acid.

$l_1$ represents an integer from 1 to 10.

R23 to R25 each represent a hydrogen atom. However, any one hydrogen selected from the group consisting of R23 to R25 may optionally be substituted by a substituent represented by Chemical Formula 250 below.

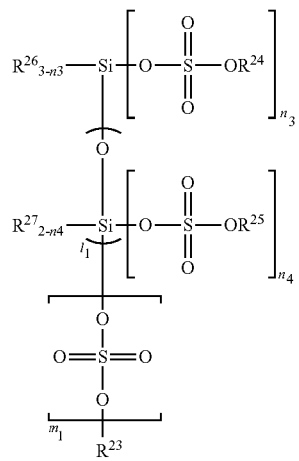

[Chemical Formula 250]

In Chemical Formula 250, any one of the R26's and R27's is a linking group linked to a structure represented by Chemical Formula 230, while the others each, independently, represent any one selected from the group consisting of a hydrogen atom, a halogen atom, a C1-C10 alkyl group, a C1-C10 alkoxy group, and a C6-C30 aryl group. That is, in a case in which there are two units of R26 and one unit of R27, one of them is a linking group linked to a structure represented by Chemical Formula 230, while the other two may each, independently, represent any one selected from the group consisting of a hydrogen atom, a halogen atom, a C1-C10 alkyl group, a C1-C10 alkoxy group, and a C6-C30 aryl group. Furthermore, in a case in which there is only one unit of R26 and zero units of R27, R26 is a linking group linked to a structure represented by Chemical Formula 230.

Further, $n_3$ represents an integer from 0 to 3; $n_4$ represents an integer from 0 to 2; $m_1$ represents an integer of 0 or 1; and $l_1$ represents an integer from 1 to 10.

R23 to R25 may each, independently, represent a hydrogen atom, or may be substituted by a second substituent represented by Chemical Formula 250. That is, a second substituent represented by Chemical Formula 250 may be substituted at any one of the R23- to R25-positions, and a third substituent represented by Chemical Formula 250 may be substituted again at any one of the R23- to R25-positions.

When the resultant siloxane inorganic acid salt obtained by the successive progression of the reactions as described above are exemplified similarly to the cases of Chemical Formulas 201 to 210, the examples include compounds represented by Chemical Formulas 231 to 239 below. Here, in the following Chemical Formulas 231 to 239, the definitions for R11-1 to R11-7 are the same as the definition for R11; the definitions for R12-1 to R12-3 are the same as the definition for R12; and the definitions for R13-1 to R13-3 are the same as the definition for R13.

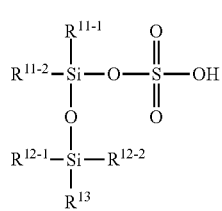

[Chemical Formula 231]

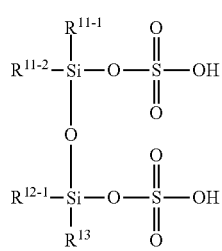

[Chemical Formula 232]

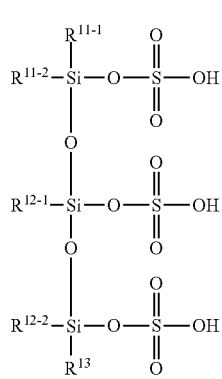

[Chemical Formula 233]

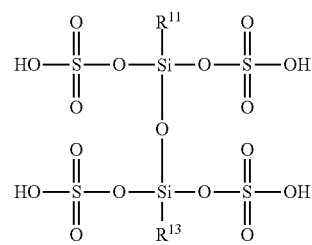

[Chemical Formula 234]

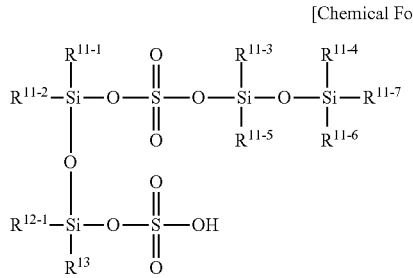

[Chemical Formula 235]

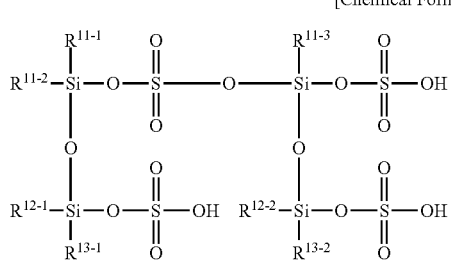

[Chemical Formula 236]

-continued

[Chemical Formula 237]

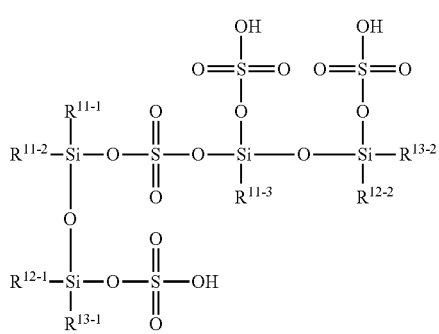

[Chemical Formula 238]

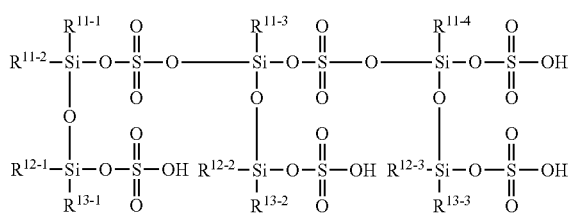

[Chemical Formula 239]

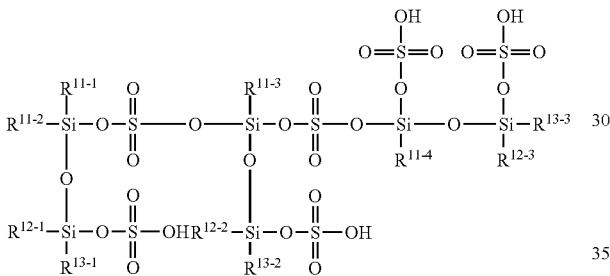

The present invention is not limited to the compounds exemplified above by Chemical Formulas 231 to 239, and various modifications can be made based on the above-described compounds as references.

According to another embodiment, the silane inorganic acid salt may be a siloxane inorganic acid salt produced by reacting a second inorganic acid comprising nitric acid with the siloxane compound represented by Chemical Formula 20.

At this time, the siloxane inorganic acid salt may be represented by Chemical Formula 260 below.

[Chemical Formula 260]

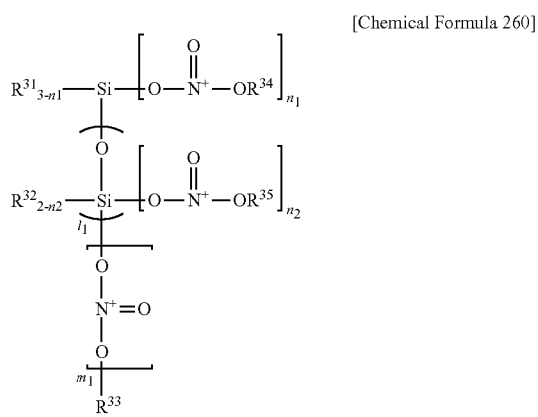

In Chemical Formula 260, R31 and R32 each, independently, represent any one selected from the group consisting of a hydrogen atom, a halogen atom, a C1-C10 alkyl group, a C1-C10 alkoxy group, and a C6-C30 aryl group, wherein the halogen atom may be a fluoro group, a chloro group, a bromo group, or an iodo group, while the halogen atom is preferably a fluoro group or a chloro group.

Further, $n_1$ represents an integer from 0 to 3; $n_2$ represents an integer from 0 to 2; $m_1$ represents an integer of 0 or 1; and the relation $n_1+n_2+m_1 \geq 1$ is satisfied. That is, Chemical Formula 260 contains at least one atomic group derived from the second inorganic acid comprising nitric acid.

Additionally, $l_1$ represents an integer from 1 to 10.

R33 to R35 each, independently, represent a hydrogen atom. However, any one hydrogen selected from the group consisting of R33 to R35 may optionally be substituted by a substituent represented by Chemical Formula 280 below.

[Chemical Formula 280]

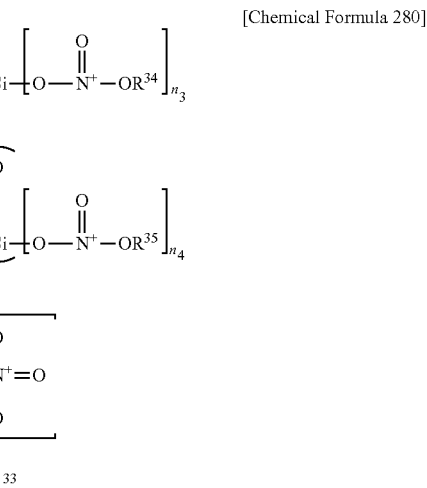

In Chemical Formula 280, any one of the R36's and R37's is a linking group linked to a structure represented by Chemical Formula 260, while the others each, independently, represent any one selected from the group consisting of a hydrogen atom, a halogen atom, a C1-C10 alkyl group, a C1-C10 alkoxy group, and a C6-C30 aryl group. That is, in a case in which there are two units of R36 and one unit of R37, one of them is a linking group linked to a structure represented by Chemical Formula 260, while the other two may each, independently, represent any one selected from the group consisting of a hydrogen atom, a halogen atom, a C1-C10 alkyl group, a C1-C10 alkoxy group, and a C6-C30 aryl group. Furthermore, in a case in which there is only one unit of R36 and zero units of R37, R36 is a linking group linked to a structure represented by Chemical Formula 260.

Further, $n_3$ represents an integer from 0 to 3; $n_4$ represents an integer from 0 to 2; $m_1$ represents an integer of 0 or 1; and $l_1$ represents an integer from 1 to 10.

R33 to R35 may each, independently, represent a hydrogen atom, or they may be each substituted by a second substituent represented by Chemical Formula 280. That is, the second substituent represented by Chemical Formula 280 may be substituted at any one of the R33- to R35- positions, and a third substituent represented by Chemical Formula 280 may be substituted again at any one of the R33- to R35-positions of the second substituent represented by Chemical Formula 280.

When the resultant siloxane inorganic acid salt obtained by the successive progression of the reactions as described above are exemplified similarly to the cases of Chemical Formulas 201 to 210, the examples include compounds represented by Chemical Formulas 261 to 269 below. Here, in Chemical Formulas 261 to 269 below, the definitions for R21-1 to R21-7 are the same as the definition for R21; the definitions for R22-1 to R22-3 are the same as the definition for R22; and the definitions for R23-1 to R23-3 are the same as the definition for R23.

[Chemical Formula 261]

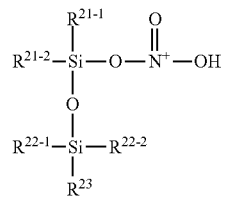

[Chemical Formula 262]

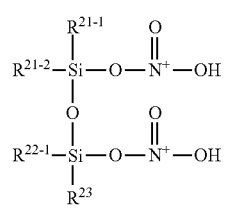

[Chemical Formula 263]

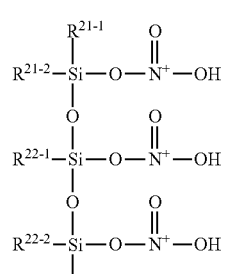

[Chemical Formula 264]

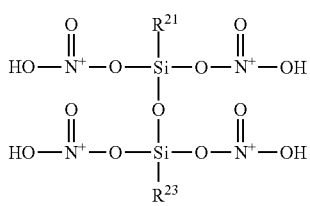

[Chemical Formula 265]

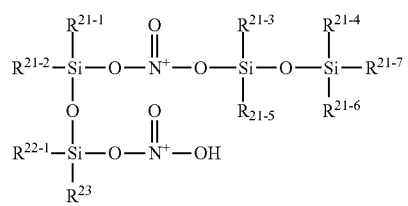

[Chemical Formula 266]

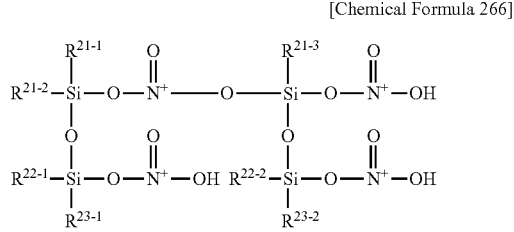

[Chemical Formula 267]

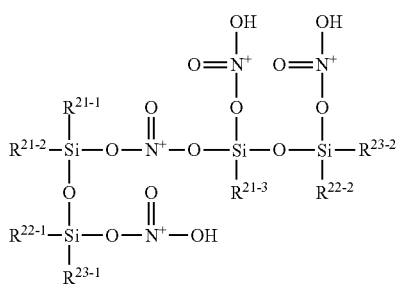

[Chemical Formula 268]

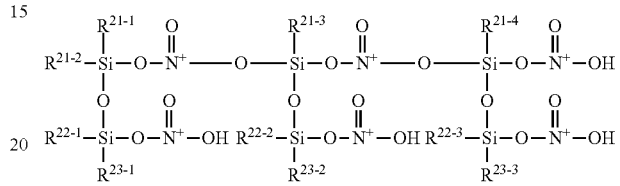

[Chemical Formula 269]

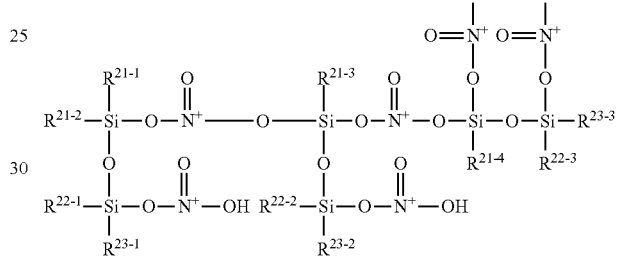

The present invention is not intended to be limited to the compounds exemplified by Chemical Formulas 261 to 269, and various modifications can be made based on the above-described compounds as references.

Meanwhile, the siloxane compound that can react with the second inorganic acid to produce the siloxane inorganic acid salt represented by Chemical Formula 200 may be a compound represented by Chemical Formula 20. The details of the compound represented by Chemical Formula 20 are as described above.

The method of manufacturing the siloxane inorganic acid salt by reacting the second inorganic acid with a siloxane compound is the same as the method of manufacturing the silane inorganic acid salt by reacting the second inorganic acid with a silane compound, except that a siloxane compound is used instead of a silane compound.

Furthermore, the second additive may include an alkoxysilane compound represented by Chemical Formula 300 below.

[Chemical Formula 300]

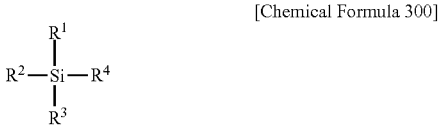

In Chemical Formula 300, R1 to R4 each, independently, represent any one selected from the group consisting of a hydrogen atom, a halogen atom, a hydroxyl group, a C1-C10 alkyl group, a C1-C10 alkoxy group, a C1-C10 aminoalkyl group, a C1-C10 aminoalkoxy group, and a C6-C30 aryl group; and at least one of R1 to R4 represents a C1-C10 alkoxy group, a C1-C10 aminoalkyl group, or a C1-C10 aminoalkoxy group.

Specifically, the alkoxysilane compound represented by Chemical Formula 300 may be any one selected from the group consisting of tetramethoxysilane (TMOS), tetrapropoxysilane, methyltrimethoxysilane (MTMOS), methyltriethoxysilane (MTEOS), methyltripropoxysilane, ethyltrimethoxysilane, ethyltriethoxysilane, ethylthripropoxysilane, propyltrimethoxysilane (PrTMOS), propyltriethoxysilane (PrTEOS), propyltripropoxysilane, dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane, dipropyldipropoxysilane, trimethylmethoxysilane, trimethylethoxysilane, trimethylpropoxysilane, triethylmethoxysilane, triethylethoxysilane, triethylpropoxysilane, tripropylmethoxysilane, tripropylethoxysilane, tripropylpropoxysilane, 3-chloropropyltrimethoxysilane, 3-aminopropyltrimethoxysilane, 3-aminopropyltriethoxysilane, [3-(2-aminoethyl)aminopropyl]trimethoxysilane, 3-mercaptopropyltrimethoxysilane, 3-methacryloxypropyltrimethoxysilane, 3-acryloxypropyltrimethoxysilane, and mixtures thereof. Furthermore, the alkoxysilane compound represented by Chemical Formula 300 may be any one selected from the group consisting of butyl(methoxy)dimethylsilane, 3-cyanopropyldimethylmethoxysilane, trimethylethoxysilane, trimethylmethoxysilane, hexyldimethoxysilane, methyldiethoxysilane, 4-aminobutyldimethylmethoxysilane, 3-aminopropyldimethylethoxysilane, butyltrimethoxysilane, ethyltriethoxysilane, isobutyltriethoxysilane, methyltrimethoxysilane, tetramethoxysilane, tetraethoxysilane, triethoxysilane, butyltriethoxysilane, trimethylpentylsilane, 3-(2-aminoethyl)aminopropyltrimethoxysilane, 3-aminopropyltriethoxysilane, tris(dimethylamino)silane, and mixtures thereof.

Additionally, the second additive may include a siloxane compound represented by Chemical Formula 350 below.

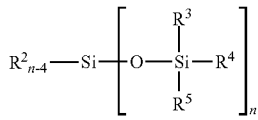

[Chemical Formula 350]

In Chemical Formula 350, R2 to R5 each, independently, represent any one selected from the group consisting of a hydrogen atom, a halogen atom, a hydroxyl group, a C1-C10 alkyl group, a C1-C10 alkoxy group, a C1-C10 aminoalkyl group, a C1-C10 aminoalkoxy group, and a C6-C30 aryl group; at least one of R2 to R5 represents a C1-C10 alkoxy group, a C1-C10 aminoalkyl group, or a C1-C10 aminoalkoxy group; and n represents an integer from 1 to 4.

Specifically, the siloxane compound represented by Chemical Formula 350 may be any one selected from the group consisting of tris(trimethylsiloxy)silane, tetrakis(trimethylsiloxy)silane, (aminopropyl)tris(trimethylsiloxy)silane, (aminopropyl)tris(diethylaminosiloxy)silane, (aminopropyl)tris(methylethylaminosiloxy)silane, tris(trimethylsiloxy)methylsilane, tris(diethylaminosiloxy)methylsilane, tris(methylethylaminosiloxy)methylsilane, and mixtures thereof.

In the alkoxysilane compound represented by Chemical Formula 300 or the siloxane compound represented by Chemical Formula 350, the bond between a silicon atom and an oxygen atom is unstable, and is likely to be easily broken. However, in a case in which the alkoxysilane compound represented by Chemical Formula 300 or the siloxane compound represented by Chemical Formula 350 contains an amino group, the atomic group containing an amino group can stabilize the bond between a silicon atom and an oxygen atom. That is, the production of reaction side products that may be generated as a result of breakage of the unstable bond between a silicon and oxygen atom can be minimized. Therefore, the amount of particles produced during the etching process can be minimized, thereby facilitating the minimization of defects that may occur in the subsequent processes due to particles.

Further, the oxygen atoms included in the alkoxysilane compound represented by Chemical Formula 300 or the siloxane compound represented by Chemical Formula 350 can be bonded to the surface of an oxide film to protect the oxide film. For instance, the oxygen atoms included in the alkoxysilane compound represented by Chemical Formula 300 or the siloxane compound represented by Chemical Formula 350 may form hydrogen bonds with the surface of an oxide film, and thus, etching of an oxide film which occurs during the etching of a nitride can be minimized. Therefore, the etch selectivity for a nitride film with respect to an oxide film can be increased.

Additionally, the second additive may include an oxime compound represented by Chemical Formula 400 below. When the composition for etching includes the oxime compound represented by Chemical Formula 400, the etch rate for a silicon oxide film can be minimized, while a satisfactory etch rate and etch speed for a silicon nitride film can be secured. That is, when a silicon nitride film and a silicon oxide film layer exist together, it is possible to obtain an effect of etching only the silicon nitride film with almost no etching influence on the silicon oxide film. Furthermore, in the case of using the oxime compound represented by the Chemical Formula 400 together with the alkoxysilane compound represented by Chemical Formula 300 or the siloxane compound represented by Chemical Formula 350, the solubility of these compounds can be increased.

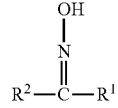

[Chemical Formula 400]

In Chemical Formula 400, R1 and R2 each, independently, represent any one selected from the group consisting of a hydrogen atom, a halogen atom, a C1-C20 alkyl group, a C1-C20 alkoxy group, a C2-C20 alkenyl group, a C3-C20 cycloalkyl group, a C1-C20 aminoalkyl group, a C6-C20 aryl group, a C1-C20 alkylcarbonyl group, a C1-C20 alkylcarbonyloxy group, and a C1-C10 cyanoalkyl group.

Specifically, the oxime compound may be any one selected from the group consisting of acetone oxime, 2-butanone oxime, acetaladehyde oxime, cyclohexanone oxime, acetophenone oxime, cyclodecanone oxime, and mixtures thereof.

The second additive may also include an oxime silane compound represented by Chemical Formula 500 below. In a case in which the composition for etching includes the oxime silane compound represented by Chemical Formula 500, the etch rate for a silicon oxide film can be minimized, while a satisfactory etch rate and etch speed for a silicon nitride film can be secured. That is, when a silicon nitride film and a silicon oxide film layer exist together, it is possible to obtain an effect of etching only the silicon nitride film with almost no etching influence on the silicon oxide film. Furthermore, a high etch rate and etch selectivity can be obtained compared to conventional compositions for etching, and even in the case of being used for a long time period, there is no problem with a decrease in the etch rate for a silicon nitride film. Thus, the composition for etching can effectively be applied during the production of semiconductor devices for which the selective etching of silicon nitride films is needed.

[Chemical Formula 500]

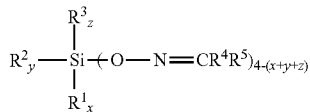

In Chemical Formula 500, R1 to R3 each, independently, represent any one selected from the group consisting of a hydrogen atom, a halogen atom, a C1-C20 alkyl group, a C2-C20 alkenyl group, a C3-C20 cycloalkyl group, a C6-C20 aryl group, a C7-C20 arylalkyl group, and a C1-C20 alkylcarbonyl group.

More specifically, R1 to R3 may each, independently, represent a hydrogen atom, a methyl group, an ethyl group, an n-propyl group, an isopropyl group, an n-butyl group, a tert-butyl group, a pentyl group, a hexyl group, a vinyl group, an acetyl group, a benzyl group, or a phenyl group.

In Chemical Formula 500, R4 and R5 may each, independently, represent any one selected from the group consisting of a C1-C20 alkyl group, a C3-C20 cycloalkyl group, a C6-C20 aryl group, a C7-C20 arylalkyl group, and a C1-C20 alkylcarbonyl group, or R4 and R5 may be linked to each other as a C3-C12 alkylene group to form an alicyclic ring.

More specifically, R4 and R5 may each, independently, represent a methyl group, an ethyl group, an n-propyl group, an isopropyl group, an n-butyl group, a tert-butyl group, a pentyl group, a hexyl group, a benzyl group, or a phenyl group, or R4 and R5 may be fused together to form a cyclohexyl group.

In Chemical Formula 500, x, y, and z each, independently, represent an integer from 0 to 3, and x+y+z represents an integer from 0 to 3.

Specifically, the oxime silane compound may be any one selected from the group consisting of di(ethyl ketoxime) silane, mono(ethy ketoxime)silane, tris(ethyl ketoxime)silane, tetra(ethyl ketoxime)silane, methyl tris(methyl ethyl ketoxime)silane, methyl tris(acetoxime)silane, methyl tris(methyl isobutyl ketoxime)silane, dimethyl di(methyl ethyl ketoxime)silane, trimethyl (methyl ethyl ketoxime)silane, tetra(methyl ethyl ketoxime)silane, tetra(methyl isobutyl ketoxime)silane, vinyl tris(methyl ethyl ketoxime)silane, methyl vinyl di(methyl ethyl ketoxime)silane, vinyl tris(methyl isobutyl ketoxime)silane, and phenyl tris(methyl ethyl ketoxime)silane.

Meanwhile, the first inorganic acid is added as an etching agent for etching a nitride film, and any inorganic acid capable of etching a nitride film may be used. For example, any one selected from the group consisting of sulfuric acid, nitric acid, phosphoric acid, silicic acid, hydrofluoric acid, boric acid, hydrochloric acid, perchloric acid, and mixtures thereof may be used. The first inorganic acid, mixed with the solvent in advance to form an aqueous solution, can be mixed with the first additive.

Phosphoric acid may preferably be used as the first inorganic acid in order to achieve etch selectivity for a nitride film with respect to an oxide film. The phosphoric acid can play the role of supplying hydrogen ions into the composition for etching, thereby accelerating the etching process. In the case of using phosphoric acid as the first inorganic acid, the composition for etching may further include sulfuric acid as an additive. The sulfuric acid may be helpful in the etching of a nitride film by elevating the boiling point of the composition for etching comprising phosphoric acid as the first inorganic acid.

The content of the first inorganic acid may be 70% to 99% by weight, preferably 70% to 90% by weight, and more preferably 75% to 85% by weight, with respect to the total weight of the composition for etching. When the first inorganic acid is included at a proportion of less than 70% by weight, a nitride film may not be easily removed, and there is a risk that particle generation may occur. When the first inorganic acid is included at a proportion exceeding 99% by weight, high selectivity for a nitride film cannot be obtained.

The composition for etching may include a solvent as the balance of the above-mentioned components. Specifically, the solvent may be water, deionized water, or the like.

The composition for etching may further include an ammonium-based compound at a proportion of 0.01% to 20% by weight with respect to the total amount of the composition for etching. In a case in which the composition for etching further includes the ammonium-based compound, even if the composition for etching is used for a long time period, no changes in the etching rate and etch selectivity occur, and there is an effect of maintaining a constant etch rate.

When the ammonium-based compound is added in an amount of less than 0.01% by weight, the effect of maintaining the etch selectivity when the composition for etching is employed over a long time period is reduced. When the ammonium-based compound is added in an amount in excess of 20% by weight, the etch rates for nitride films and silicon oxide films are changed, and the etch selectivity may also be changed.

Regarding the ammonium-based compound, any one selected from an aqueous ammonia solution, ammonium chloride, ammonium acetate, ammonium phosphate, ammonium peroxydisulfate, ammonium sulfate, and ammonium hydrofluoride, or a mixture of two or more kinds thereof may be used. Furthermore, the ammonium-based compound is not limited to the above-described compounds, and any compound containing ammonium ions may be used. For example, as the ammonium-based compound, $NH_3$ and HCl may be used together.

The composition for etching may further include a fluorine-based compound at a proportion of 0.01% to 1% by weight with respect to the total amount of the composition for etching. When the fluorine-based compound is added in an amount of less than 0.01% by weight, the etch rate for a nitride film is reduced, and the removal of a nitride film may become difficult. When the fluorine-based compound is added in an amount in excess of 1% by weight, the etch rate for a nitride film is significantly increased; however, there is a disadvantage that an oxide film is also etched.

Regarding the fluorine-based compound, any one selected from hydrogen fluoride, ammonium fluoride, and ammonium hydrogen fluoride, or a mixture of two or more kinds thereof may be used. More preferably, it is desirable to use ammonium hydrogen fluoride because the etch selectivity is maintained upon long-term use.

Meanwhile, the composition for etching may further include any optional additives that are conventionally used in the related art in order to enhance the etching performance. Examples of the additives that may be used include a surfactant, a chelating agent, and a corrosion inhibitor.

Since the composition for etching includes the silane inorganic acid salt described above, it can display markedly high etch selectivity for a nitride film with respect to an oxide film, and therefore, it may be used for a nitride film etching process.

Accordingly, the etching of an oxide film during an etching process can be minimized, and thus the EFH can easily be regulated. Furthermore, upon the selective removal of a nitride film through etching, deterioration of the electrical characteristics caused by damage to the film quality of an oxide film as well as etching of an oxide film can be prevented, while also preventing particle generation, thereby facilitating the enhancement of device characteristics.

A method of manufacturing a semiconductor device according to another aspect of the present invention includes an etching process employing the composition for etching described above.

According to an embodiment, such an etching process involves etching of a nitride film, and more particularly, selective etching of a nitride film with respect to an oxide film.

The nitride film may include silicon nitride films, for example, a SiN film and a SiON film.

Furthermore, the oxide film may be a silicon oxide film, for example, at least one or more films selected from the group consisting of a spin-on-dielectric (SOD) film, a high-density plasma (HDP) film, a thermal oxide film, a borophosphate silicate glass (BPSG) film, a phosphosilicate glass (PSG) film, a borosilicate glass (BSG) film, a polysilazane (PSZ) film, a fluorinated silicate glass (FSG) film, a low-pressure tetraethyl orthosilicate (LP-TEOS) film, a plasma-enhanced tetraethyl orthosilicate (PETEOS) film, a high temperature oxide (HTO) film, a medium temperature oxide (MTO) film, an undoped silicate glass (USG) film, a spin-on-glass (SOG) film, an advanced planarization layer (APL) film, an atomic layer deposition (ALD) film, a plasma-enhanced oxide (PE-oxide) film, an O3-tetraethyl orthosilicate (O3-TEOS) film, and combinations thereof.

An etching process employing the above-described composition for etching may be executed using any well-known wet etching method, for example, an immersion method or a spraying method.

During the etching process, the process temperature may be adjusted to the range of 50° C. to 300° C., and preferably 100° C. to 200° C., and the optimum temperature may be adjusted as necessary, in consideration of other processes and other factors.

According to a method of manufacturing a semiconductor device, which includes an etching process executed using the composition for etching described above, in a case in which nitride films and oxide films are alternately stacked or exist as a mixture, selective etching for nitride films is enabled. Furthermore, particle generation, which has been a problem in conventional etching processes, can be prevented, and thus process stability and reliability can be secured.

Therefore, such a method can be efficiently applied to various operations where selective etching for a nitride film with respect to an oxide film is needed, in a semiconductor device production process.

Figure 3:
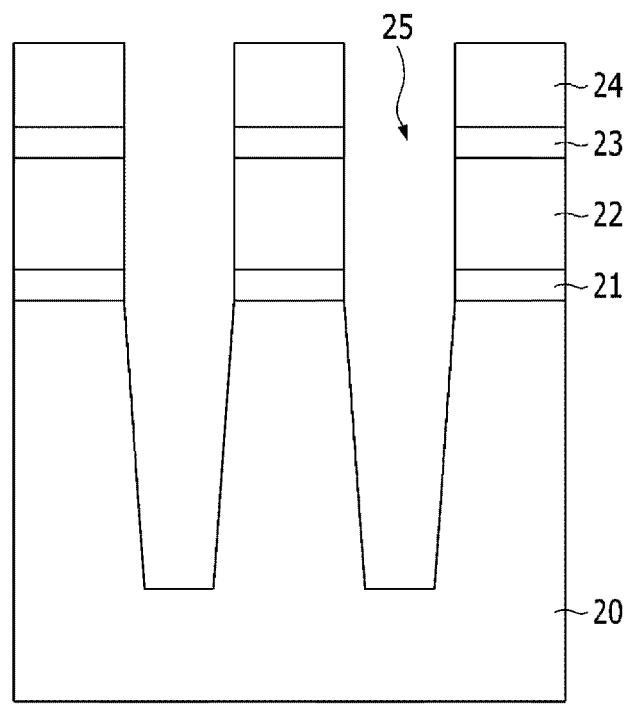
FIG. 3, FIG. 4, and FIG. 5 are process cross-sectional views for explaining a device separation process for a flash memory device, including an etching process employing a composition for etching according to an embodiment of the present invention.
Figure 4:
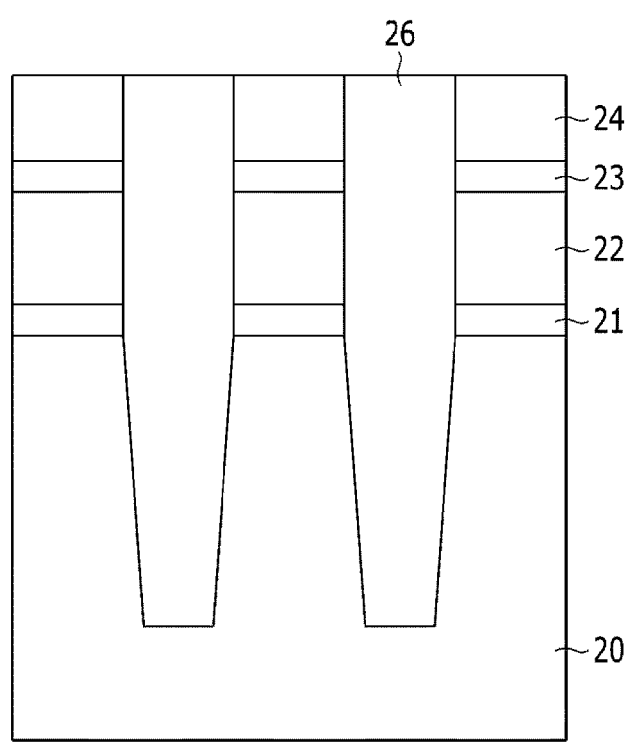
Figure 5:
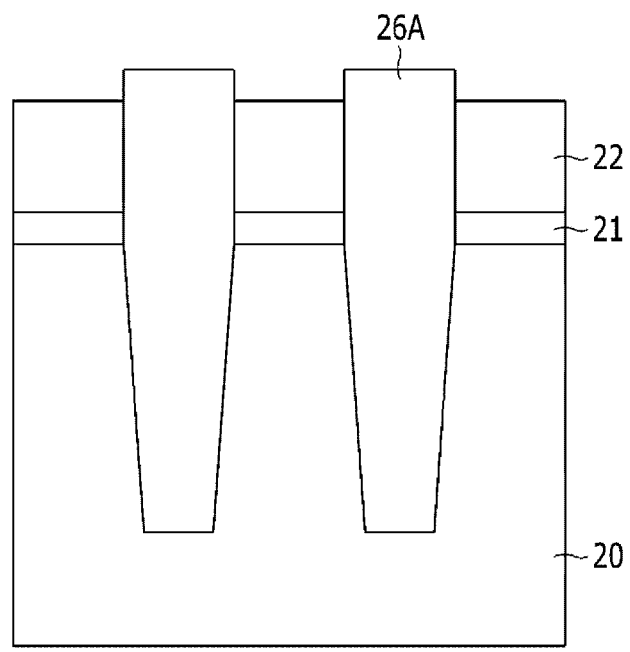

FIG. 3, FIG. 4, and FIG. 5 are process cross-sectional views for explaining a device separation process for a flash memory device, including an etching process employing the composition for etching according to an embodiment of the present invention.

As shown in FIG. 3, a tunnel oxide film 21, polysilicon film 22, buffer oxide film 23, and pad nitride film 24 are sequentially formed on the substrate 20.

Subsequently, the pad nitride film 24, buffer oxide film 23, polysilicon film 22, and tunnel oxide film 21 are selectively etched through photolithography and etching processes, and thus, device separation regions of the substrate 20 are exposed.

Next, the exposed areas of the substrate 20 are selectively etched using the pad nitride film 24 as a mask, and trenches 25 having a predetermined depth from the surface are formed.

As depicted in FIG. 4, an oxide film 26 is formed over the entire surface of a substrate 20 through a chemical vapor deposition (CVD) method or the like, until the trenches 25 are gap-filled.

Subsequently, a chemical mechanical polishing (CMP) process is performed for oxide film 26 using the pad nitride film 24 as a polishing stop film.

Next, a washing process is performed using dry etching.

According to FIG. 5, the pad nitride film 24 is selectively removed by a wet etching process employing the composition for etching according to the present invention, and then the buffer oxide film 23 is removed by a washing process. Thereby, a device separation film 26A is formed in the field region.

As illustrated in FIG. 5, according to the present invention, through employment of a high-selectivity composition for etching having a high selectivity for a nitride film with respect to an oxide film, nitride films can be completely and selectively removed during a sufficient time while the etching of oxide films gap-filled in an STI pattern is minimized. Accordingly, the effective oxide film height (EFH) can easily be controlled, while deterioration of the electrical characteristics caused by oxide film damage or etching, as well as particle generation, can be prevented, and thus the device characteristics can be enhanced.

The embodiments described above have been described with regard to flash memory devices; however, the high-selectivity composition for etching according to the present invention is also applicable to device separation processes for DRAM devices.

FIG. 6, FIG. 7, FIG. 8, FIG. 9, FIG. 10, and FIG. 11 are process cross-sectional views for explaining a process for forming channels in a flash memory device, including an etching process employing the composition for etching according to another embodiment of the present invention.

Figure 6:
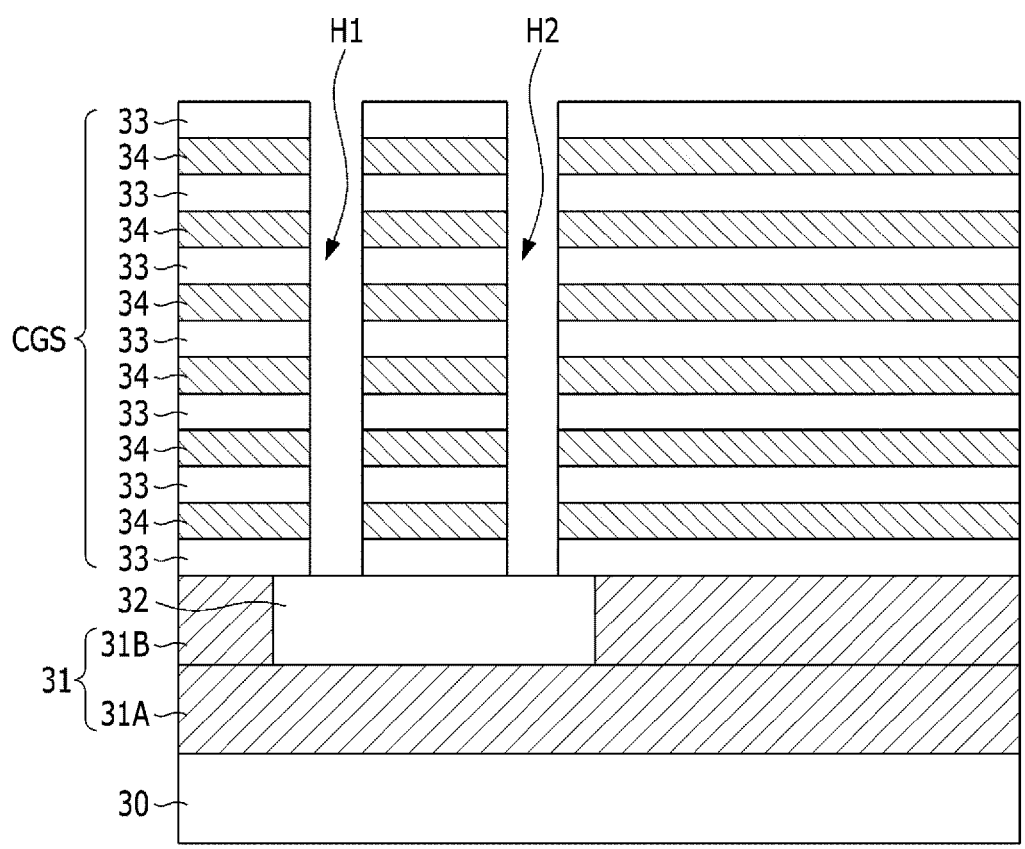
FIG. 6, FIG. 7, FIG. 8, FIG. 9, FIG. 10, and FIG. 11 are process cross-sectional views for explaining a pipe channel forming process for a flash memory device, including an etching process employing a composition for etching according to an embodiment of the present invention.

According to FIG. 6, a pipe gate electrode film 31 having a nitride film 32 embedded therein, which is intended for forming pipe channels therein, is formed on a substrate 30. A first conductive film 31A and a second conducive film 31B that constitute the pipe gate electrode film 31 may contain, for example, polysilicon doped with impurities.

More specifically, the first conductive film 31A is formed on the substrate 30, a nitride film is deposited on the first conductive film 31A, and this nitride film is patterned to form a nitride film 32 for forming pipe channels. Subsequently, the second conductive film 31*b* is formed on the first conductive film 31A that is exposed by the nitride film 32. The first conductive film 31A and second conductive film 31B constitute the pipe gate electrode film 31.

Next, in order to form a plurality of memory cells that are stacked on the results of the process in a perpendicular direction, a first interlayer insulating film 33 and first gate electrode film 34 are alternately stacked. Hereinafter, for the convenience of description, the structure obtained by alternate stacking of the first interlayer insulating films 33 and first gate electrode films 34 will be referred to as a cell gate structure (CGS).

Here, the first interlayer insulating films 33 are intended for providing separation between a plurality of layers of memory cells, and may comprise, for example, an oxide film. The first gate electrode film 34 may comprise, for example, polysilicon doped with impurities. In the present embodiment, six layers of first gate electrode film 34 are shown in the diagram; however, the invention is not intended to be limited thereto.

Subsequently, the cell gate structure (CGS) is selectively etched, and thereby a pair of first and second holes H1 and H2 that expose the nitride film 32 are formed. The first and second holes H1 and H2 are spaces for channel formation in memory cells.

Figure 7:
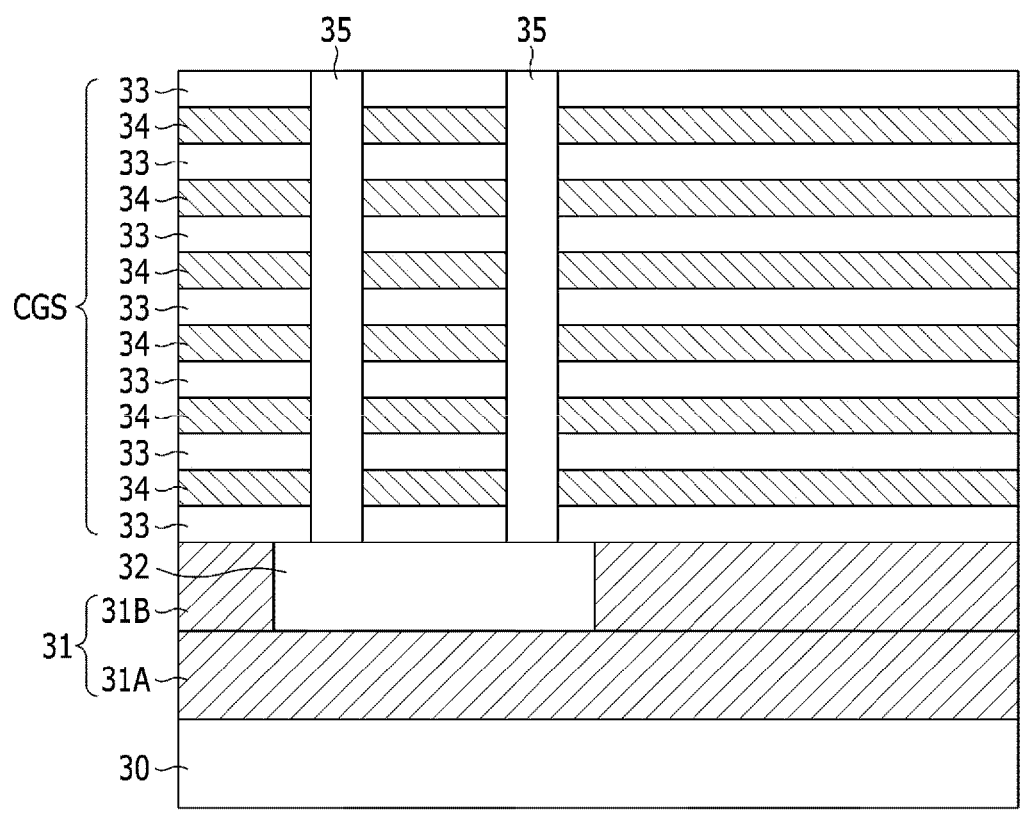

As depicted in FIG. 7, a nitride film 35 that is embedded in the first and second holes H1 and H2 is formed. This nitride film 35 is intended for preventing any damage that may occur when the first gate electrode film 34 is exposed by the first and second holes H1 and H2 in the trench forming process that will be described below (see FIG. 8).

Figure 8:
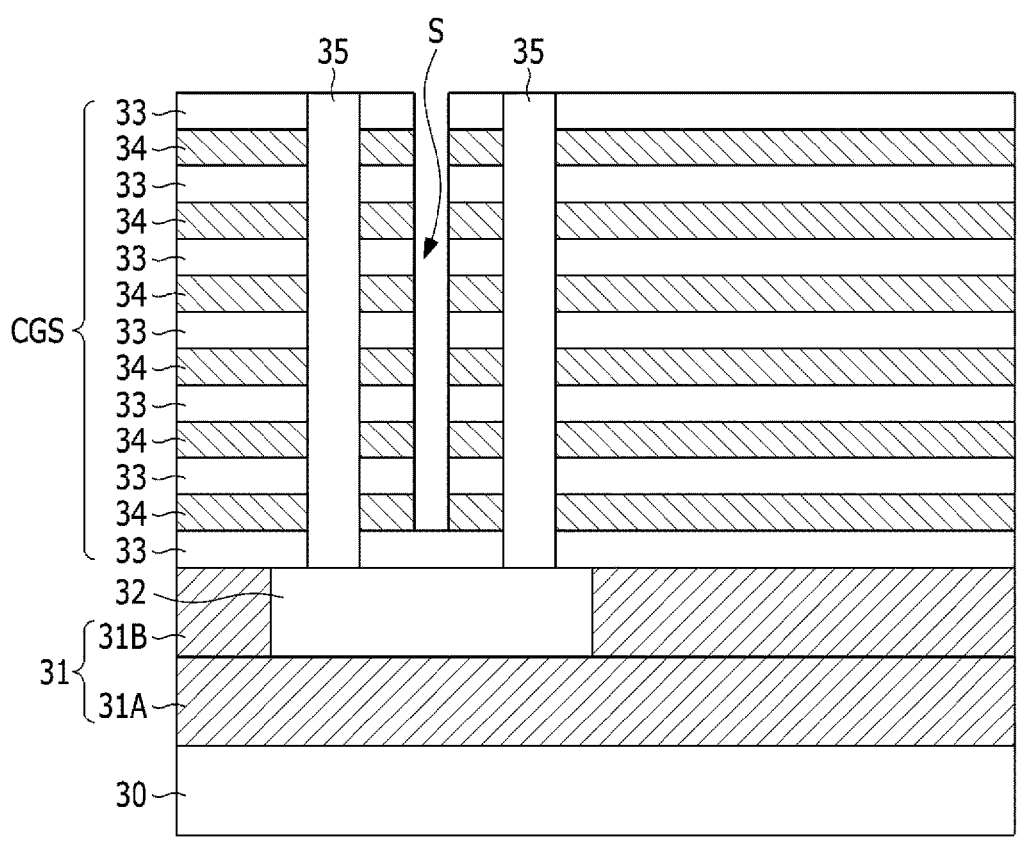

According to FIG. 8, the cell gate structure (CGS) existing between a pair of first and second holes H1 and H2 is selectively etched, and thereby a trench S is formed, so that a plurality of layers of first gate electrode film 34 are separated into portions corresponding to each of the first hole and second hole H1 and H2.

Figure 9:
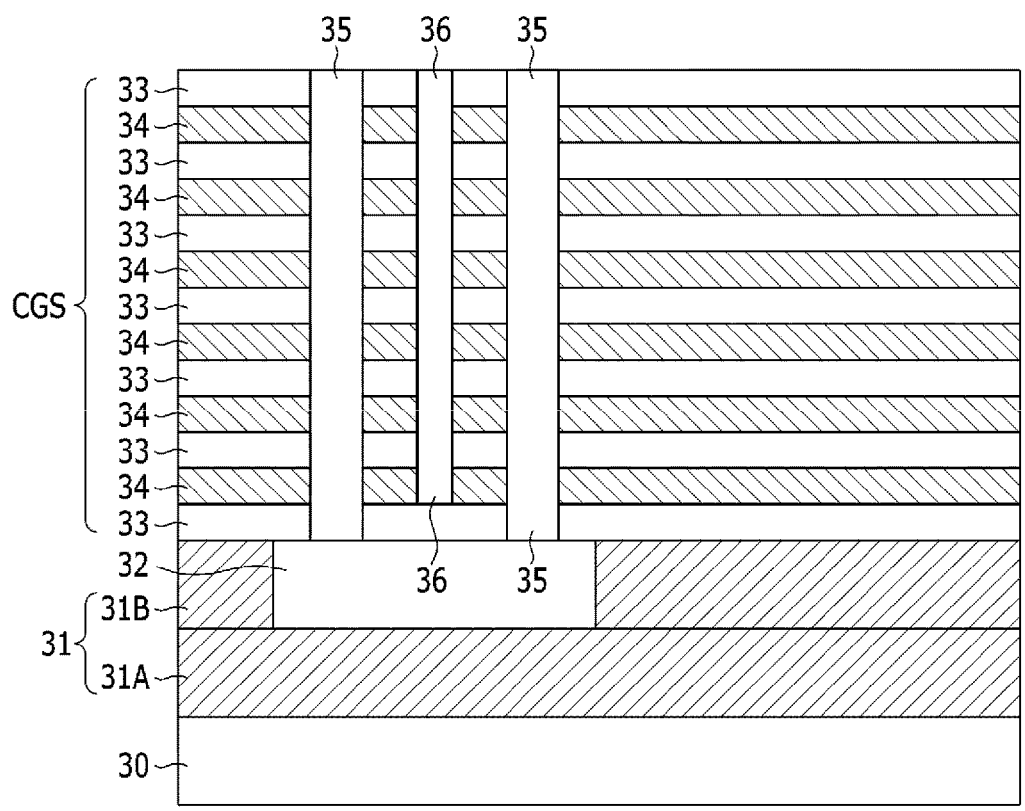

According to FIG. 9, a sacrificial film 36 that is embedded in the trench S is formed.

Figure 10:
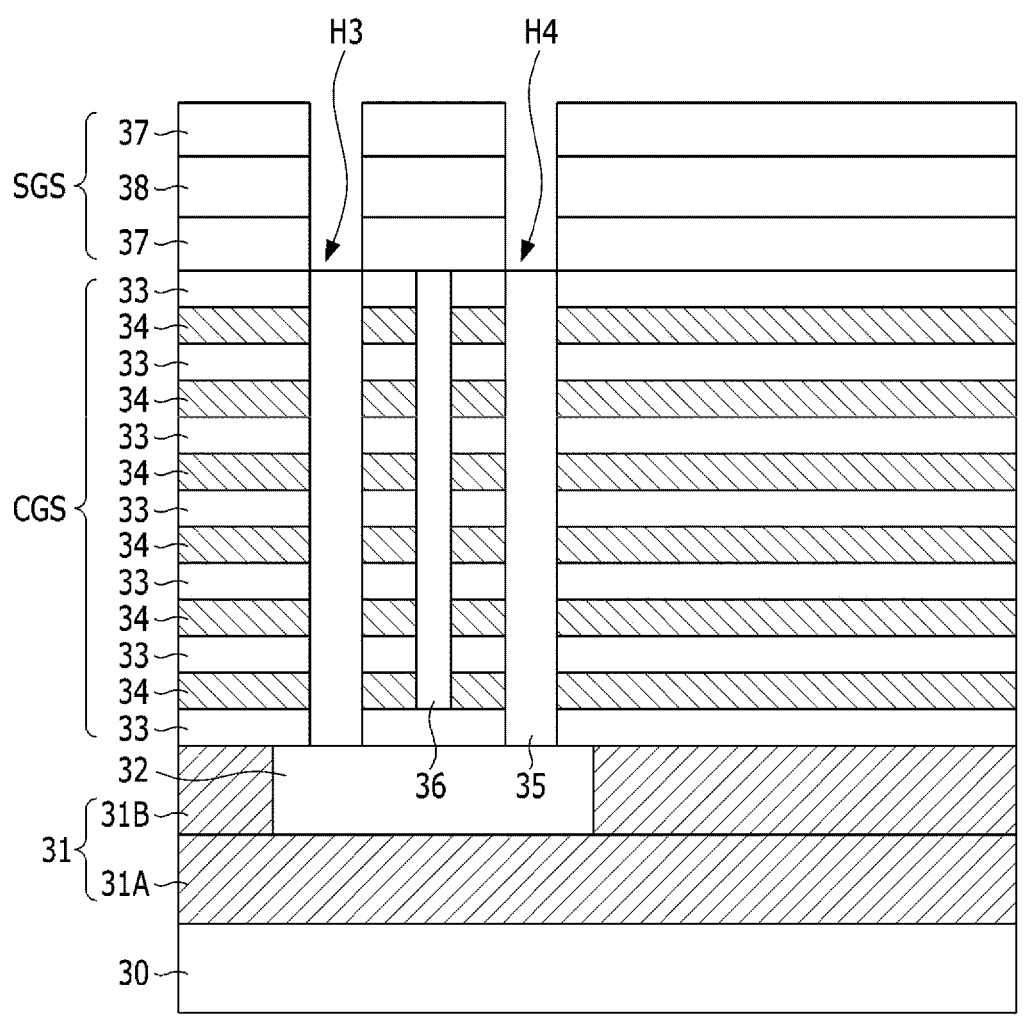

As shown in FIG. 10, a second interlayer insulating film 37, second gate electrode film 38, and second interlayer insulating film 37 are sequentially formed on the process result, for the formation of a selection transistor. In the following description, for the convenience of explanation, a layered structure comprising a second interlayer insulating film 37, second gate electrode film 38, and second interlayer insulating film 37 will be referred to as a selective gate structure (SGS).

The second interlayer insulating film 37 may comprise, for example, an oxide film, and the second gate electrode film 38 may comprise, for example, polysilicon doped with impurities.

Subsequently, the selective gate structure (SGS) is selectively etched, and thereby, third and fourth holes H3 and H4 that expose the nitride film 35 embedded in the pair of first and second holes H1 and H2 are formed. The third and fourth holes H3 and H4 are regions in which the channels of a selection transistor will be formed.

Figure 11:
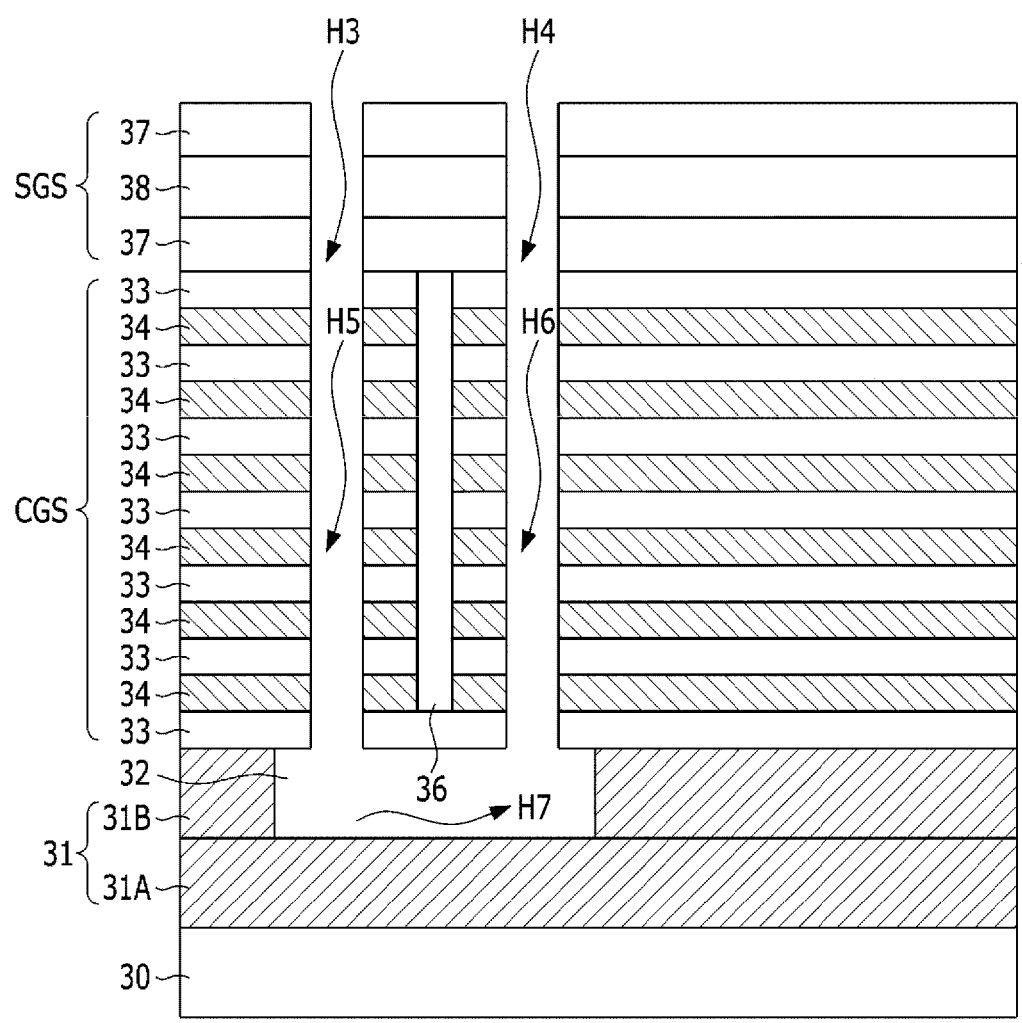

According to FIG. 11, the nitride film 35 that is exposed by the third and fourth holes H3 and H4, and the nitride film 32 disposed therebelow are selectively removed by a wet etching process employing the composition for etching according to the present invention.

As a result of the present process, a pair of cell channel holes H5 and H6 in which the channel films of the memory cell will be formed, and a pipe channel hole H7 that is disposed below the cell channel holes H5 and H6 and which connects these holes with each other, are formed. Here, by using the high-selectivity composition for etching according to the present invention, the nitride films are completely and selectively removed during a sufficient time without loss of the oxide films, and the pipe channels can therefore accurately be formed without loss of the profile. Furthermore, particle generation, which has conventionally posed a problem, can be prevented, and the safety and reliability of the processes can be secured.

Thereafter, subsequent process, for example, a floating gate forming process and a control gate forming process, are executed, and thus a flash memory device is formed.

Figure 12:
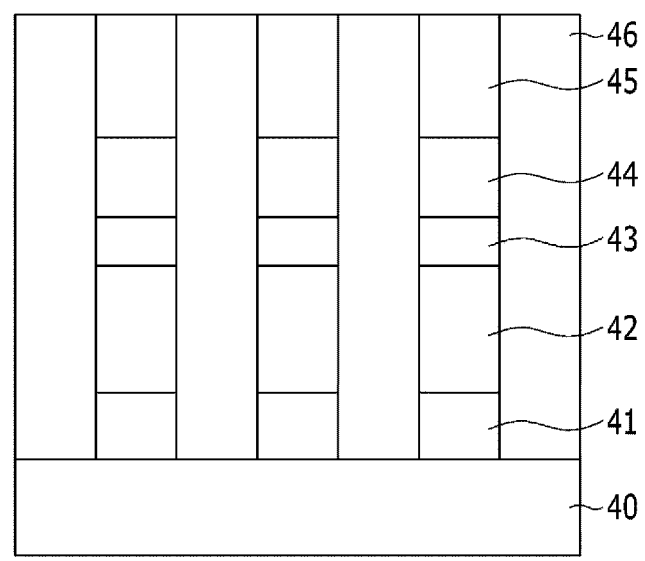
FIG. 12 and FIG. 13 are process cross-sectional views for explaining a diode forming process for a phase change memory, including an etching process employing a composition for etching according to another embodiment of the present invention.
Figure 13:
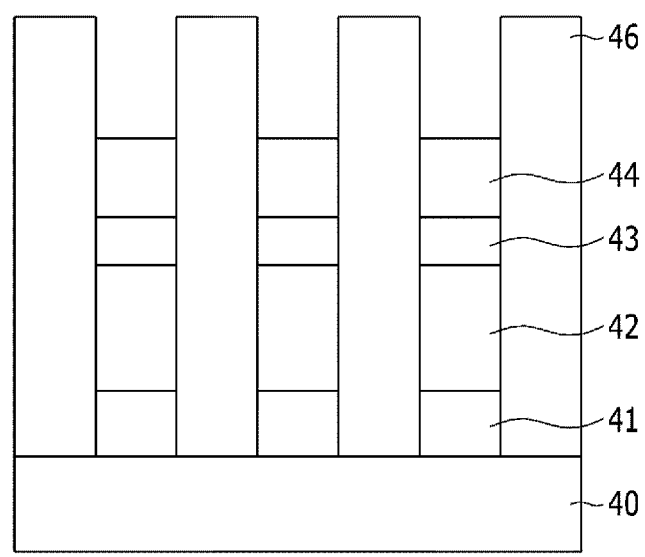

FIG. 12 and FIG. 13 are process cross-sectional views explaining a process for forming a diode in a phase change memory device, including an etching process employing the composition for etching according to another embodiment of the present invention.

According to FIG. 12, an insulating structure having openings through which a conductive region 41 is exposed is provided on a substrate 40. The conductive region 41 may be, for example, an $n^+$ impurity region.

Subsequently, a polysilicon film 42 is formed so as to embed portions of the openings, and then ion implantation of impurities is carried out so as to form a diode.

Next, a titanium silicide film 43 is formed on top of the polysilicon film 42. The titanium silicide film 43 can be formed by forming a titanium film and then heat-treating the titanium film so as to react with the polysilicon film 42.

Subsequently, a titanium nitride film 44 and a nitride film 45 are sequentially formed on top of the titanium silicide film 43.

Next, a dry etching process is executed using a hard mask, and thereby an oxide film 46 is formed in an isolated space between the diodes thus formed. Subsequently, a CMP process is performed, and a primary structure of lower electrodes that are separated from each other is formed.

As illustrated in FIG. 13, the process result is subjected to a wet etching process employing the composition for etching according to the present invention, and thus the nitride film 45 at the top is selectively removed. As such, through employment of the high-selectivity composition for etching according to the present invention, the nitride film can be completely and selectively removed during a sufficient time without loss of the oxide film. Furthermore, the deterioration of electrical characteristics caused by damage to the film quality of the oxide film and etching of the oxide film, as well as particle generation, can be prevented, and thus the device characteristics can be enhanced.

Titanium is subsequently deposited in the spaces where the nitride film 45 has been removed, and thus lower electrodes are formed.

In addition to the processes described above, a method of manufacturing a semiconductor device which includes an etching process carried out using the composition for etching of the present invention can be efficiently applied particularly to processes where the selective removal of a nitride film is required, for example, to a process where selective etching of a nitride film is required in a case in which nitride films and oxide films are alternately stacked, or in which they exist as a mixture.

Hereinafter, Examples of the present invention will be described in detail so that those having ordinary skill in the art to which the present invention pertains can easily execute the invention. However, the present invention can be realized in various different forms and is not intended to be limited to the Examples described herein.

Production Examples: Production of Compositions for Etching

Example 1

A composition for etching was produced by mixing 99 wt % of phosphoric acid (85% aqueous solution) as a first inorganic acid and 1 wt % of dimethyldimethoxysilane as a first additive.

Example 2

A composition for etching was produced by mixing 98 wt % of phosphoric acid (85% aqueous solution) as a first inorganic acid and 2 wt % of diethyldimethoxysilane as a first additive.

Example 3

A composition for etching was produced by mixing 99.5 wt % of phosphoric acid (85% aqueous solution) as a first inorganic acid and 0.5 wt % of hexamethyldisiloxane as a first additive.

Example 4

A composition for etching was produced by mixing 99 wt % of phosphoric acid (85% aqueous solution) as a first inorganic acid and 1 wt % of hexamethyldisilazane as a first additive.

Example 5

A composition for etching was produced by mixing 98.5 wt % of phosphoric acid (85% aqueous solution) as a first inorganic acid, 1 wt % of diethyldiethoxysilane as a first additive, and 0.5 wt % of a second additive represented by Chemical Formula 53-1, which is an additive in which the R1-1 group in Chemical Formula 53 is a methyl group.

[Chemical Formula 53-1]

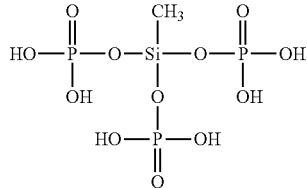

Example 6

A composition for etching was produced by mixing 98.8 wt % of phosphoric acid (85% aqueous solution) as a first inorganic acid, 1 wt % of dimethyldimethoxysilane as a first additive, and 0.2 wt % of an additive represented by Chemical Formula 53-1 as a second additive.

Example 7

A composition for etching was produced by mixing 99 wt % of phosphoric acid (85% aqueous solution) as a first inorganic acid, 0.5 wt % of hexamethyldisiloxane as a first additive, and 0.5 wt % of an additive represented by Chemical Formula 53-1 as a second additive.

Example 8

A composition for etching was produced by mixing 98.8 wt % of phosphoric acid (85% aqueous solution) as a first inorganic acid, 1 wt % of hexamethyldisilazane as a first additive, and 0.2 wt % of an additive represented by Chemical Formula 53-1 as a second additive.

Comparative Example 1

A composition for etching was produced by using 100 wt % of phosphoric acid (85% aqueous solution) as a first inorganic acid without a first additive and a second additive.

Comparative Example 2

A composition for etching was produced by using 99.5 wt % of phosphoric acid (85% aqueous solution) as a first inorganic acid and 0.5 wt % of an additive represented by Chemical Formula 53-1 as a second additive, without a first additive.

Comparative Example 3

A composition for etching was produced by using 99.8 wt % of phosphoric acid (85% aqueous solution) as a first inorganic acid and 0.2 wt % of an additive represented by Chemical Formula 53-1 as a second additive, without a first additive.

TABLE 1

| | First inorganic acid | First additive (wt %) | Second additive (wt %) |
|---|---|---|---|
| Example 1 | phosphoric acid (the remaining amount) | dimethyldimethoxysilane (1) | |
| Example 2 | phosphoric acid (the remaining amount) | diethyldiethoxysilane (2) | |
| Example 3 | phosphoric acid (the remaining amount) | hexamethyldidisiloxane (0.5) | |
| Example 4 | phosphoric acid (the remaining amount) | hexamethyldisilazane (1) | |
| Example 5 | phosphoric acid (the remaining amount) | diethyldietoxysilane (1) | Chemical Formula 53-1 (0.5) |
| Example 6 | phosphoric acid (the remaining amount) | dimethyldimethoxysilane (1) | Chemical Formula 53-1 (0.2) |
| Example 7 | phosphoric acid (the remaining amount) | hexamethyldisiloxane (0.5) | Chemical Formula 53-1 (0.5) |
| Example 8 | phosphoric acid (the remaining amount) | hexamethyldisilazane (1) | Chemical Formula 53-1 (0.2) |
| Comparative Example 1 | phosphoric acid (the remaining amount) | | |

TABLE 1-continued

| | First inorganic acid | First additive (wt %) | Second additive (wt %) |
|---|---|---|---|
| Comparative Example 2 | phosphoric acid (the remaining amount) | | Chemical Formula 53-1 (0.5) |
| Comparative Example 3 | phosphoric acid (the remaining amount) | | Chemical Formula 53-1 (0.2) |

Experimental Example 1: Measurement of Selectivity of Produced Compositions for Etching Etching of a nitride film and an oxide film at a process temperature of 157° C. was performed using the compositions for etching produced in the Examples and Comparative Examples described above, and the etch rate and selectivity for a nitride film and an oxide film were measured using an ellipsometer (NANOVIEW, SEMG-1000), which is a thin film thickness measuring apparatus. The etch rates and selectivity values are presented in Table 2. The etch rate is the value obtained by etching a film for 300 seconds and subsequently comparing the film thickness measured before the etching treatment with the film thickness measured after the etching treatment by dividing the difference of the film thicknesses by the etching time (minutes), while the selectivity represents the ratio of the etch rate for a nitride film with respect to the etch rate for an oxide film.

Meanwhile, in order to simulate an actual high-temperature phosphoric acid process, a preliminary operation of arbitrarily dissolving a silicon nitride film in the compositions for etching produced as described above and increasing the silicon concentration in the solution, was carried out. At the time of performing the process, as the silicon nitride film is etched, the silicon concentration in the solution increases, and thereby, the etch rate of a silicon oxide film is further decreased. The preliminary operation was carried out until the silicon concentration in the solutions reached 50 ppm, 100 ppm, 150 ppm, and 200 ppm, respectively, and then the etching was performed. The results are presented in Tables 2 and 3 below.

TABLE 2

| Classification | Process Temperature (° C.) | Silicon Concentration (ppm) | Nitride Etching Speed (Å/min) | Oxide Etching Speed (Å/min) | Nitride/Oxide Film Selectivity |
|---|---|---|---|---|---|
| Example 1 | 157 | 0 | 74.58 | 3.00 | 24.86 |
| | 157 | 50 | 74.02 | 1.89 | 39.16 |
| | 157 | 100 | 74.78 | 1.05 | 69.31 |
| | 157 | 200 | 69.85 | 0.53 | 131.79 |
| Example 2 | 157 | 0 | 74.25 | 3.15 | 23.57 |
| | 157 | 50 | 73.00 | 2.01 | 36.32 |
| | 157 | 100 | 69.25 | 1.23 | 56.30 |
| | 157 | 200 | 68.74 | 0.64 | 107.41 |
| Example 3 | 157 | 0 | 74.26 | 3.10 | 23.95 |
| | 157 | 50 | 73.58 | 2.15 | 34.22 |
| | 157 | 100 | 71.26 | 1.87 | 38.11 |
| | 157 | 200 | 70.58 | 0.87 | 81.13 |
| Example 4 | 157 | 0 | 73.83 | 0.08 | 23.97 |
| | 157 | 50 | 74.90 | 2.06 | 36.36 |
| | 157 | 100 | 69.90 | 1.23 | 56.83 |
| | 157 | 200 | 67.31 | 0.45 | 149.58 |
| Example 5 | 157 | 0 | 68.21 | 0.28 | 243.61 |
| | 157 | 50 | 67.03 | 0.13 | 515.62 |
| | 157 | 100 | 66.58 | 0.05 | 1331.60 |
| | 157 | 200 | 65.12 | 0.01 | 6512.00 |
| Example 6 | 157 | 0 | 69.25 | 0.31 | 223.39 |
| | 157 | 50 | 67.47 | 0.13 | 519.00 |
| | 157 | 100 | 65.71 | 0.06 | 1095.17 |
| | 157 | 200 | 65.46 | 0.02 | 3273.00 |
| Example 7 | 157 | 0 | 67.89 | 0.31 | 226.30 |
| | 157 | 50 | 67.31 | 0.12 | 560.92 |
| | 157 | 100 | 65.74 | 0.07 | 939.14 |
| | 157 | 200 | 63.65 | 0.01 | 6365.00 |
| Example 8 | 157 | 0 | 67.90 | 0.26 | 261.15 |
| | 157 | 50 | 65.45 | 0.11 | 595.00 |
| | 157 | 100 | 65.03 | 0.04 | 1625.75 |
| | 157 | 200 | 64.47 | 0.01 | 6447.00 |

TABLE 3

| Classification | Process Temperature (° C.) | Silicon Concentration (ppm) | Nitride Etching Speed (Å/min) | Oxide Etching Speed (Å/min) | Nitride/Oxide Film Selectivity |
|---|---|---|---|---|---|
| Comparative Example 1 | 157 | 0 | 74.87 | 3.04 | 24.63 |
| | 157 | 50 | 73.54 | 1.23 | 59.79 |
| | 157 | 100 | 65.26 | 0.44 | 148.32 |
| | 157 | 200 | 63.47 | −0.06 | −1057.83 |
| Comparative Example 2 | 157 | 0 | 68.12 | 0.28 | 243.29 |
| | 157 | 50 | 66.47 | 0.05 | 1329.40 |
| | 157 | 100 | 65.57 | −0.01 | −6557.00 |
| | 157 | 200 | 64.22 | −0.12 | −535.17 |
| Comparative Example 3 | 157 | 0 | 68.03 | 0.32 | 212.59 |
| | 157 | 50 | 66.73 | 0.03 | 2224.33 |
| | 157 | 100 | 64.60 | −0.02 | −3230.00 |
| | 157 | 200 | 62.78 | −0.10 | −627.80 |

According to Tables 2 and 3, when comparing the etch selectivity of Examples 1 to 8 with the first additive and Comparative Examples 1 to 3 without the first additive, it can be confirmed that the compositions for etching of Examples 1 to 8 show higher etch selectivity for a nitride film with respect to an oxide film. In particular, the compositions for etching of Examples 5 to 8 which also comprised the second additive showed higher etch selectivities of 223 to 6512, which is significantly high.

The present invention is not intended to be limited by the embodiments described above and the attached drawings, and it will be obvious to those having ordinary skill in the art to which the present invention pertains that various replacements, alterations, and modifications can be made to the extent that the technical idea of the present invention is maintained.

The present invention relates to a composition for etching, particularly, a high-selectivity composition for etching that can selectively remove a nitride film while minimizing the etch rate of an oxide film, and a method of manufacturing a semiconductor device using the same.

Since the composition for etching according to the invention has a feature in that the etch selectivity for a nitride film with respect to an oxide film is high, the EFH can easily be regulated by controlling the etch rate of an oxide film.

Furthermore, when the composition for etching of the present invention is employed, damage to the film quality of an oxide film or deterioration of electrical characteristics caused by etching of an oxide film which occurs at the time of removing a nitride film can be prevented, while particle generation can also be prevented, and thus the device characteristics can be improved.

Therefore, the present invention is widely applicable to various processes such as semiconductor production processes where the selective removal of a nitride film with respect to an oxide film is required; a device separation process for, for example, a flash memory device; a process for forming a pipe channel in a 3D flash memory device; and a process for forming a diode in a phase change memory, and the present invention can improve the process efficiency.

LIST OF REFERENCES 20, 30, 40: Substrate
21: Tunnel oxide film
22: Polysilicon film
23: Buffer oxide film
24: Pad nitride film
25: Trench
26: Oxide film
26A: Device separation film
31: Pipe gate electrode film
32, 35: Nitride film
36: Sacrificial film
33: First interlayer insulating film
34: First gate electrode film
37: Second interlayer insulating film
38: Second gate electrode film
41: Conduction region
42: Polysilicon film
43: Titanium silicide film
44: Titanium nitride film
45: Nitride film
46: Oxide film

What is claimed is:

1. A composition for etching, comprising,
a first inorganic acid,
a first additive represented by Chemical Formula 1, and
a solvent,
wherein the first inorganic acid is phosphoric acid,
wherein the composition for etching selectively etches a nitride layer with respect to an oxide layer,
wherein etch selectivity of the composition for etching is from 24.86 to 6512.

[Chemical Formula 1]

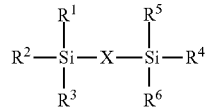

(In Chemical Formula 1, X is N,
R1 to R6 are each, independently, selected from the group consisting of hydrogen, a C1-C20 alkyl group, a C1-C20 alkoxy group, a C2-C20 alkenyl group, a C3-C20 cycloalkyl group, a C1-C20 aminoalkyl group, a C6-C20 aryl group, a C1-C20 alkyl carbonyl group, a C1-C20 alkyl carbonyloxy group, and a C1-C10 cyano alkyl group).

2. The composition for etching of claim 1, wherein the composition for etching includes 0.01 to 15 wt % of the first additive, 70 to 99 wt % of the first inorganic acid, and the remaining amount as solvent.

3. The composition for etching of claim 1, wherein the composition for etching further comprises a second additive comprising a silane inorganic acid salt produced by reacting a second inorganic acid with a silane compound.

4. A method of manufacturing a semiconductor device, comprising an etching process performed using the composition for etching of claim 1.

* * * * *